United States Patent
Skinner et al.

(10) Patent No.: US 9,818,672 B2
(45) Date of Patent: Nov. 14, 2017

(54) FLOW DIVERSION DEVICES

(71) Applicant: INTEL IP CORPORATION, Santa Clara, CA (US)

(72) Inventors: Michael P. Skinner, San Jose, CA (US); Sven Albers, Regensburg (DE); Harald Gossner, Riemerling (DE); Peter Baumgartner, Munich (DE); Hans-Joachim Barth, Munich (DE)

(73) Assignee: INTEL IP CORPORATION, Santa Clara, CA (US)

( * ) Notice: Subject to any disclaimer, the term of this patent is extended or adjusted under 35 U.S.C. 154(b) by 0 days.

(21) Appl. No.: 14/181,325

(22) Filed: Feb. 14, 2014

(65) Prior Publication Data
US 2015/0235920 A1    Aug. 20, 2015

(51) Int. Cl.
    *H01L 23/467*       (2006.01)
    *H01L 23/473*       (2006.01)

(52) U.S. Cl.
CPC .......... *H01L 23/467* (2013.01); *H01L 23/473* (2013.01); *H01L 2224/0401* (2013.01); *H01L 2224/0557* (2013.01); *H01L 2224/06181* (2013.01); *H01L 2224/16145* (2013.01); *H01L 2224/16146* (2013.01); *H01L 2224/16225* (2013.01); *H01L 2224/1703* (2013.01); *H01L 2224/17181* (2013.01); *H01L 2224/32225* (2013.01); *H01L 2224/73204* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2225/1035* (2013.01); *H01L 2225/1058* (2013.01); *H01L 2225/1094* (2013.01); *H01L 2924/15311* (2013.01)

(58) Field of Classification Search
CPC ... H01L 23/467; H01L 23/473; H01L 23/367; H01L 23/3735; H01L 23/373; H01L 2224/0401; H01L 2224/0558; H01L 2224/06181; H01L 2224/16145; H01L 2224/16146; H01L 2224/16225; H01L 2224/1703; H01L 2224/17181; H01L 2224/32225; H01L 2224/73204; H01L 2225/06513; H01L 2225/06517; H01L 2225/06541; H01L 2225/06565; H01L 2225/06589; H01L 2225/1035; H01L 2225/1058; H01L 2225/1094; H01L 2924/15311; H05K 7/20518
USPC ........................................................ 257/722
See application file for complete search history.

(56) References Cited

U.S. PATENT DOCUMENTS

| | | | | |
|---|---|---|---|---|
| 2,949,283 A | * | 8/1960 | Smith | .......................... 165/277 |
| 2,984,774 A | * | 5/1961 | Race | ................... H01L 23/4006 |
| | | | | 165/185 |
| 3,307,783 A | * | 3/1967 | Wiebelt | ........................ 236/1 R |
| 5,773,755 A | * | 6/1998 | Iwatare | .................... 174/17 VA |

(Continued)

*Primary Examiner* — Victoria K Hall
(74) *Attorney, Agent, or Firm* — Schwabe, Williamson & Wyatt, P.C.

(57) ABSTRACT

Embodiments of flow diversion devices (FDDs) are disclosed herein. An FDD may include a body formed of a body material and a plurality of thermally deformable fins arranged along the body. Individual fins of the plurality of fins may include first and second materials having different coefficients of thermal expansion (CTEs). Other embodiments may be disclosed and/or claimed.

7 Claims, 21 Drawing Sheets

(56) References Cited

U.S. PATENT DOCUMENTS

| | | | | |
|---|---|---|---|---|
| 5,946,190 | A * | 8/1999 | Patel | F28F 3/02 165/104.21 |
| 6,016,250 | A * | 1/2000 | Hanners | 361/695 |
| 6,128,188 | A * | 10/2000 | Hanners | H01L 23/34 165/80.3 |
| 6,219,243 | B1 * | 4/2001 | Ma | H01L 23/36 257/706 |
| 6,330,157 | B1 * | 12/2001 | Bezama et al. | 361/704 |
| 6,628,522 | B2 * | 9/2003 | Trautman et al. | 361/704 |
| 7,550,901 | B2 * | 6/2009 | Chrysler et al. | 310/330 |
| 7,778,029 | B2 * | 8/2010 | Ueno | 361/695 |
| 8,434,692 | B2 * | 5/2013 | Scott et al. | 236/93 R |
| 2003/0222341 | A1 * | 12/2003 | Oberhardt | H01L 23/467 257/706 |
| 2007/0227699 | A1 * | 10/2007 | Nishi | 165/96 |
| 2008/0205004 | A1 * | 8/2008 | Ueno | G11B 33/144 361/701 |
| 2009/0321044 | A1 * | 12/2009 | Hernon | H01L 23/34 165/80.2 |
| 2010/0089468 | A1 * | 4/2010 | Scott | F23R 3/06 137/468 |

* cited by examiner

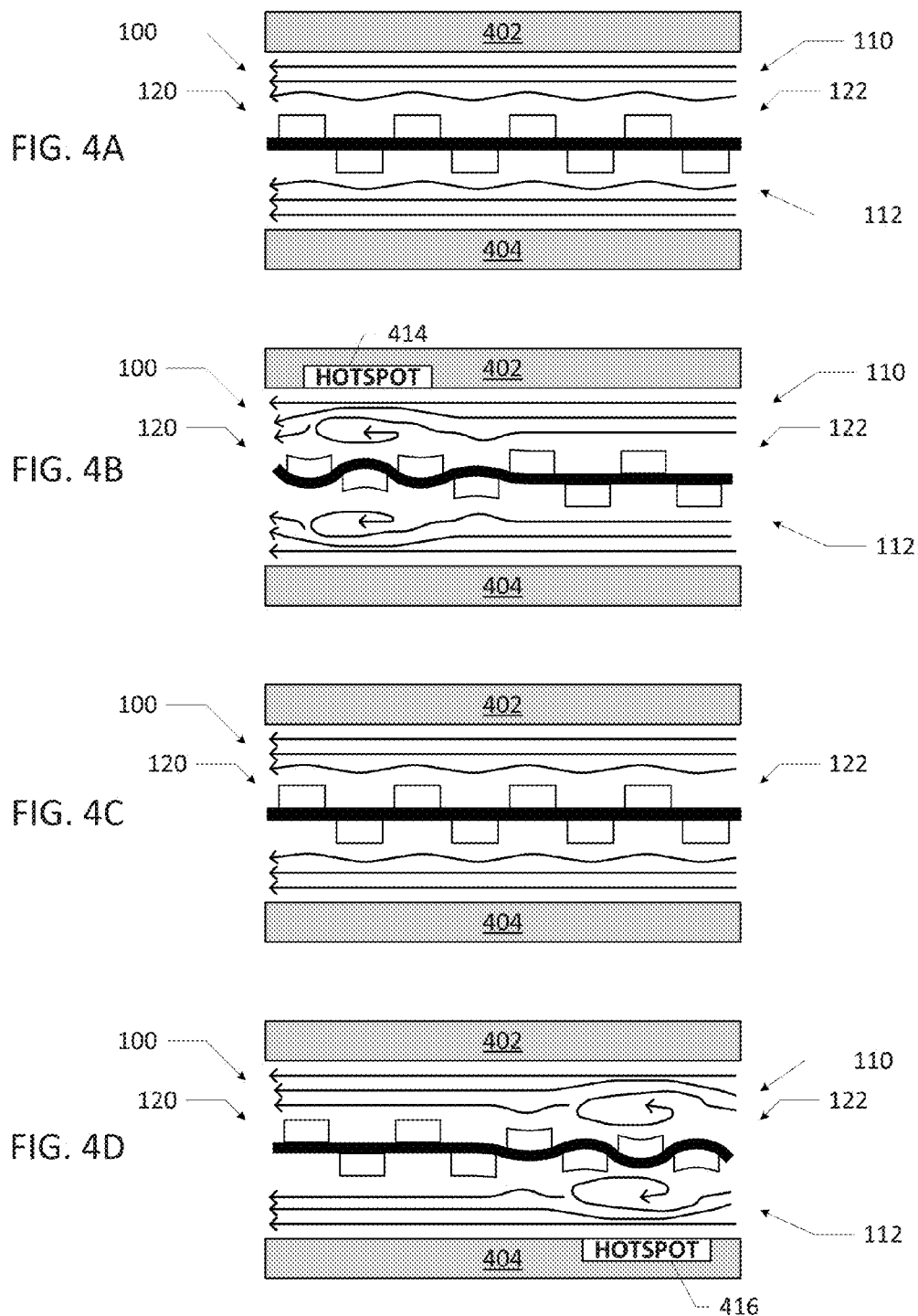

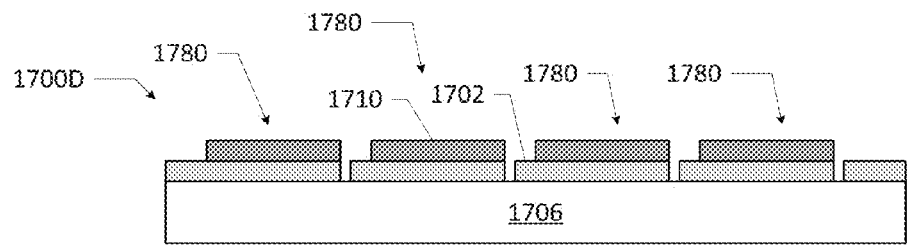
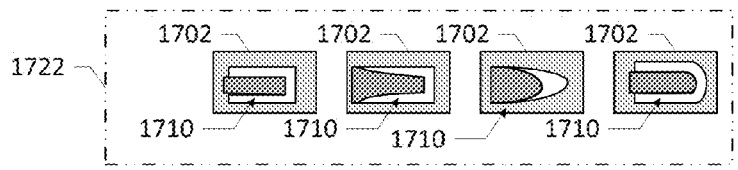
FIG. 17D
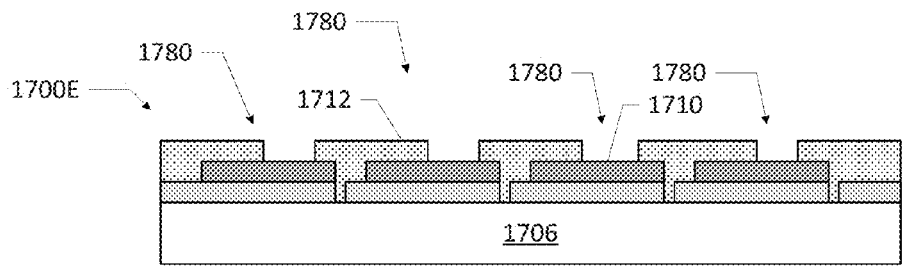
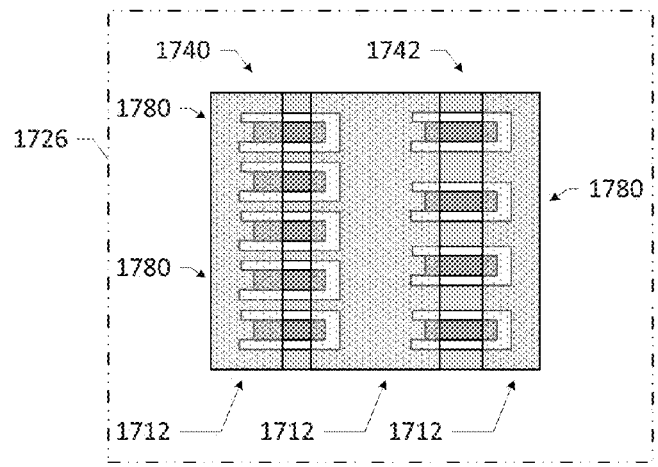
FIG. 17E

FLOW DIVERSION DEVICES

TECHNICAL FIELD

The present disclosure relates generally to the field of coolant flow, and more particularly, to flow diversion devices.

BACKGROUND

Conventional integrated circuit (IC) devices may contain one or more dies and/or packages arranged in stacks. Components in such stacks may be electrically coupled using solder balls or bumps, and an underfill material may be provided to fill the space between the components and surround the solder balls or bumps. During operation, various regions of the dies and/or packages may generate significant amounts of heat. These regions may be internal to the IC device, and therefore the heat generated in these regions may not be adequately managed using traditional external heatsinks. Additionally, the location of the hottest regions may change over time as the IC device operates in different modes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 4A-4D illustrate the diversion of flowing coolant, in response to various thermal conditions, in an IC device that includes the first FDD embodiment (FIGS. 1A-1C), in accordance with various embodiments.

FIGS. 17A-17G illustrate cross-sectional views of various stages in an example process for manufacturing the fourth FDD embodiment (FIGS. 8A-8B), in accordance with various embodiments.

DETAILED DESCRIPTION

Figure 1A:
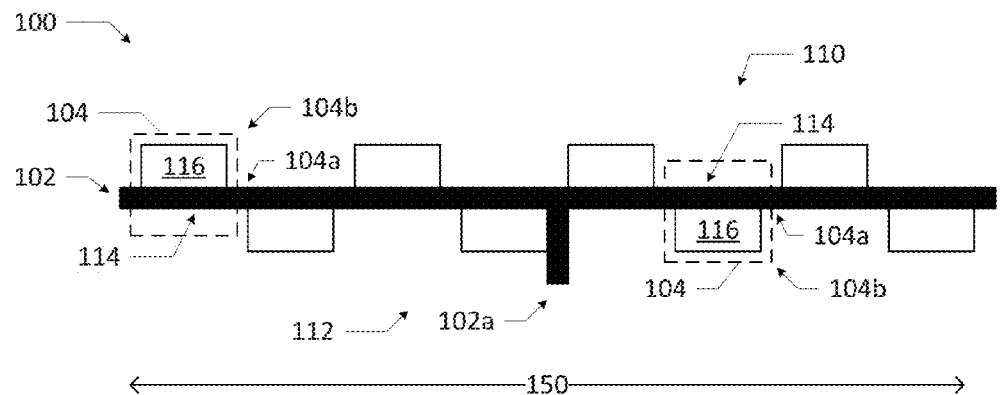
FIGS. 1A-1C are various views of a first flow diversion device (FDD) embodiment in a low temperature state.

Embodiments of flow diversion devices (FDDs) are disclosed herein. An FDD may include a body formed of a body material and a plurality of thermally deformable fins arranged along the body. Individual fins of the plurality of fins may include first and second materials having different coefficients of thermal expansion (CTEs). The FDDs disclosed herein may be included in an integrated circuit (IC) device, and may be used to divert the flow of coolant in the IC device in response to changing thermal conditions. In particular, an FDD may deform in response to changing thermal conditions (e.g., the presence of a localized "hotspot"), which may cause coolant flowing past the FDD to change its flow pattern. In some embodiments, the deformation of the FDD may cause the coolant to undergo increased turbulence proximate to a hotspot of the IC device and reduce the boundary layer of the coolant flow proximate to the hotspot, which may result in increased heat transfer between the hotspot and the coolant, thereby cooling the hotspot faster than if the turbulence were not present. In some embodiments, the deformation of the FDD may increase the volume of coolant that flows past a hotspot of the IC device relative to cooler portions of the IC device, which may result in increased heat transfer between the hotspot and the coolant, thereby cooling the hotspot faster than if the coolant volume remained constant. In some embodiments, the deformation of the FDD may "trap" the coolant proximate to a hotspot of the IC device, which may result in increased heat transfer between the hotspot and the coolant, thereby cooling the hotspot faster than if the coolant were allowed to flow away from the hotspot. An IC device may include one or more FDDs that improve heat transfer using any one or more of these mechanisms, in any combination.

The hottest regions of an IC device may be those having the most current flow through the most resistive material, and such regions may not be located near the surface of the IC device (where a traditional heat sink may be used to assist in heat dissipation). Certain devices, such as low drop-off oscillators, line drivers (e.g., for audio generation) and integrated power amplifiers, for example, may present significant cooling challenges.

Various embodiments of the FDDs disclosed herein may improve heat dissipation in IC devices, thereby improving reliability and increasing the level of performance of the IC devices. For example, the FDDs disclosed herein may be included in three-dimensional package structures, and may assist in cooling active areas of the packages by selectively diverting coolant proximate to the active areas when the active areas generate excess heat. In some embodiments, the FDDs disclosed herein may be included between dies or packages in a stacked arrangement. Traditional IC devices with stacked dies often fill the area between dies in a stack with underfill material. While the underfill material may aid in preventing stress fractures and breakages due to thermal mismatch between components, the underfill material may form a barrier to effective heat dissipation. Traditional package-on-package stack arrangements may make no provision for the effective removal of heat from within the package-on-package stack, and instead, may only provide a fairly linear channel through which coolant may only flow in a laminar manner and with constant volume. Various embodiments disclosed herein, however, may use the area between dies or packages as coolant flow channels, and may include FDDs in these channels to improve heat dissipation by selectively diverting coolant flow proximate to the hotspots. This may mitigate the heat issues arising from dense IC device designs, and may increase the achievable density of IC device designs.

As noted above, first and second materials included in an FDD may have different CTEs. In some embodiments, the higher CTE material may have a CTE greater than approximately $15 \times 10^{-6}$/degree Kelvin at 25 degrees Celsius. Examples of such materials may include aluminum and copper. In some embodiments, the lower CTE material may have a CTE less than approximately $15 \times 10^{-6}$/degree Kelvin at 25 degrees Celsius. Examples of such materials may include iron or steel, nickel, titanium, titanium nitride, tungsten, molybdenum and chromium. The materials listed above are simply illustrative, and any other suitable materials may be used. Various embodiments of the FDD of the present disclosure, as well as related methods and IC devices, are discussed below.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description uses the phrases "in an embodiment," or "in embodiments," which may each refer to one or more of the same or different embodiments. Furthermore, the terms "comprising," "including," "having," and the like, as used with respect to embodiments of the present disclosure, are synonymous. As used herein, the term "hotspot" may refer to a region of an IC device that generates more heat than nearby regions of the IC device. As used herein, the term "low temperature" may refer to temperatures in the lower half of a typical or desired operating range of an IC device, and the term "high temperature" may refer to temperatures in the upper half of a typical or desired operating range of an IC device. These ranges may vary between devices, depending upon the application, intended environment, and other operating parameters. For example, typical operating temperatures in some mobile computing devices may be between $-10$ degrees Celsius and 100 degrees Celsius. Some such mobile computing devices may be designed to operate in a temperature range of $-55$ degrees Celsius and 125 degrees Celsius or a temperature range of $-40$ degrees Celsius and 125 degrees Celsius. These ranges are simply illustrative, and suitable characterizations of "low temperature" and "high temperature" may depend on the operating characteristics of the IC device. As used herein, the term "coolant" may refer to any gas, liquid, gas dissolved in liquid, or other fluid circulated through or near an IC device to assist in transferring heat away from the IC device. In some embodiments, the coolant may include a liquid that is supersaturated with a metal or other material that may crystallize at low temperatures, and which may melt at high temperatures. When the metal or other material has a higher heat of fusion than a heat capacity, the transition from solid to liquid may provide better cooling than heating the metal or other material in its liquid form. In some embodiments, coolant fluid may be supersaturated with gallium. In some embodiments, coolant may not be supersaturated with a metal or other material as described above, but the metal or other material may be restricted by dam-like structures or trapped internally to various structures; melting such restricted or trapped metal or other material may provide similar advantages as those discussed above with reference to supersaturated solutions.

Figure 1B:
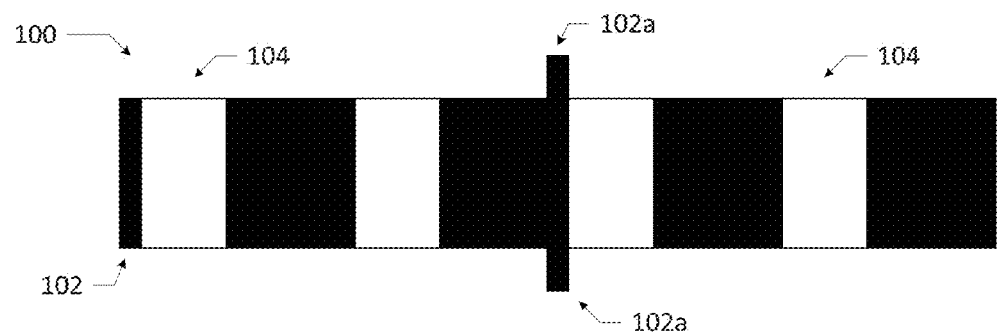
Figure 1C:
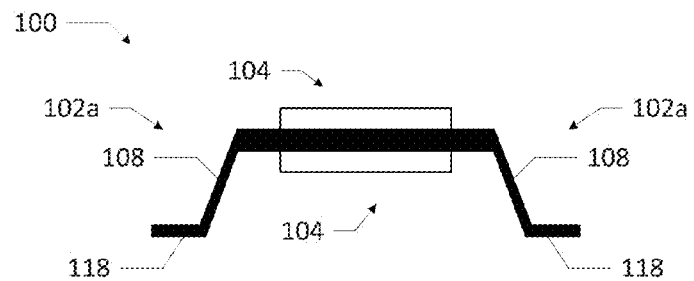

FIGS. 1A-1C are various views of an embodiment 100 of an FDD in a low temperature state. FIG. 1A is a first side view of the FDD 100, FIG. 1B is a top view of the FDD 100, and FIG. 1C is a second side view of the FDD 100. The FDD 100 may include a body 102 (including a body material) and one or more thermally deformable fins 104 arranged along the body 102. Individual fins 104 may include a first material 114 and a second material 116. The first material 114 may have a different CTE than the second material 116. In various embodiments, a fin 104 may include three or more materials having same or different CTEs. Different ones of the fins 104 of the FDD 100 may be composed of the same materials, or different ones of the fins 104 may be composed of different materials (e.g., different first materials 114 and/or different second materials 116). Although four fins 104 are illustrated in FIG. 1A, this is simply for illustrative purposes, and any number of fins may be included in the FDDs disclosed herein. Additionally, although the fins 104 are illustrated as arranged linearly, the fins 104 of the FDD 100 (and the fins of the other FDDs disclosed herein) may be arranged in a rectangular, circular, asymmetric, irregular, or any other desired arrangement.

In some embodiments, the first material 114 may be a same material as the body material. For example, as shown in FIG. 1A, the first material 114 may be contiguous with the body 102. In some such embodiments, the second material 116 of a fin 104 may extend from the body 102, and may have a CTE that is lower than a CTE of the first material 114. Embodiments in which the CTE of the second material 116 of a fin 104 is higher than a CTE of the first material 114 are discussed below (e.g., with reference to FIGS. 5A-5C). The body material of the FDD 100 may be a thermal conductor. Embodiments in which the body material of the FDD 100 is a thermal insulator are discussed below (e.g., with reference to FIGS. 6A-6C).

The FDD 100 may have a first face 110 and a second face 112 opposite the first face 110. One or more fins 104 may extend from the first face 110, and one or more fins 104 may extend from the second face 112, as shown in FIG. 1A. In some embodiments, the first material 114 and the second material 116 of a fin 104 extending from the first face 110 may be the same corresponding materials used as the first material 114 and the second material 116 of a fin 104 extending from the second face 112. In some embodiments, one or more of the materials used in a fin 104 extending from the first face 110 may be different from the corresponding materials used in a fin 104 extending from the second face 112. In some embodiments, multiple fins 104 extending from the first face 110 may be disposed along the body 102 in an alternating arrangement with multiple fins extending from the second face 112. An example of such an arrangement is shown in FIG. 1A. In some embodiments, fins 104 may only extend from one of the first face 110 and the second face 112.

Each fin 104 may include a first end 104a and a second end 104b. The first end 104a may be secured to the body 102, as shown. The second end 104b may not be secured to the body 102, but may extend away from the body 102.

In some embodiments, the body 102 may include an attachment portion 102a. The attachment portion 102a may be used to secure the FDD 100 to a portion of an IC device. The FDD 100 may have a longitudinal axis 150, and in FIGS. 1A and 1B, the attachment portion 102a is depicted as located approximately at the center point of the longitudinal extent of the body 102. This location is simply illustrative; in various embodiments, the attachment portion 102a may be located at either end of the longitudinal extent of the body 102 or at any other point along the longitudinal extent of the body 102. In some embodiments, the body 102 may include two or more attachment portions 102a. In some embodiments, the body 102 may not include an attachment portion 102a, and may not be directly secured to a portion of an IC device. However, movement of the FDD 100 (or any of the FDDs disclosed herein), relative to the IC device, may be constrained by the geometry of the IC device surrounding the FDD 100 (or other FDD). For example, the FDD 100 (or other FDD) may be disposed in a channel of the IC device, and may be constrained to remain within that channel by IC device features (e.g., solder bumps or balls, dies, or packages) arranged around the FDD 100.

In embodiments in which the body 102 includes an attachment portion 102a, the attachment portion 102a may take any of a number of forms. In the illustrative embodiment shown in FIG. 1C, the attachment portion 102a may include two legs 108 extending from the body 102 and having feet 118 disposed at the ends of the legs 108. The feet 118 may be secured to a surface of a portion of an IC device (e.g., by soldering), allowing the fins 104 to be positioned away from the surface. In some embodiments, the attachment portion 102a may include three or more legs extending from various locations along the body 102. In some embodiments, the attachment portion 102a may not include legs or feet, but may instead be a soldered or adhesive connection between one or more locations along the body 102 and a surface of a portion of an IC device. Any other structure used to secure the FDD 100 to a portion of an IC device may be used as the attachment portion 102a.

Figure 2A:
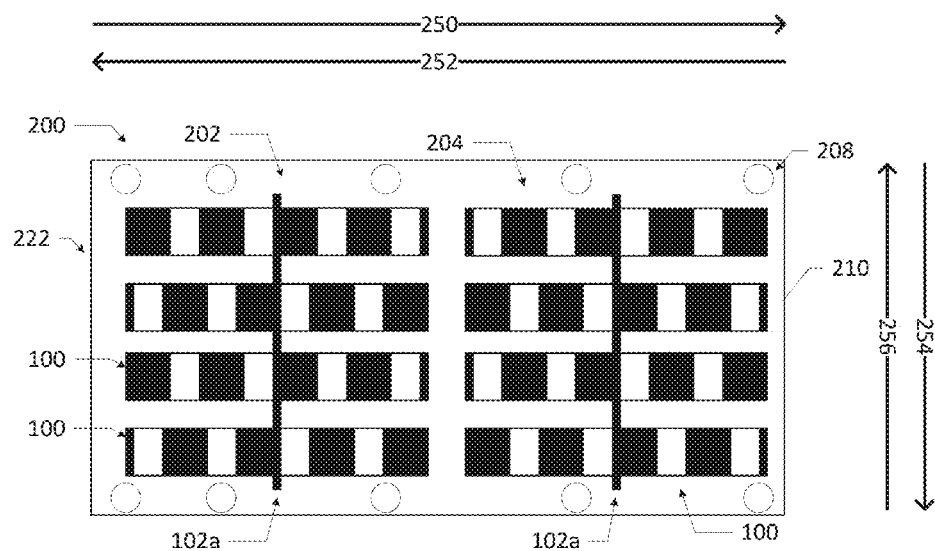
FIGS. 2A-2B are various views of multiple ones of the first FDD embodiment (FIGS. 1A-1C) arranged in an array included in an integrated circuit (IC) device, in accordance with various embodiments.
Figure 2B:
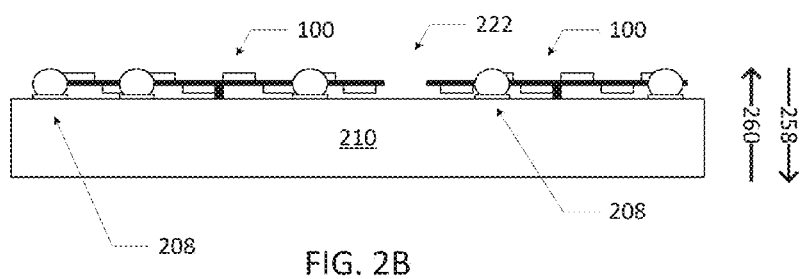

FIGS. 2A-2B are various views of multiple ones of the FDD 100 arranged in an array 200 disposed on a surface 222 of an IC component 210, in accordance with various embodiments. FIG. 2A is a top view of the array 200 disposed on the surface 222 of the IC component 210, and FIG. 2B is a side view of the array 200 disposed on the surface 222. In some embodiments, the IC component 210 may be a die or a package. The surface 222 may be proximate to active devices in the die or package, or the surface 222 may be separated from active devices in the die or package by a semiconductor substrate interconnect layer, and/or a passivation layer, for example. One or more solder bumps or balls 208 may be disposed on the surface 222, which may be used to provide connections between the IC component 210 and other dies or packages (not shown).

The array 200 may include two or more FDDs 100, which may be arranged in any desired configuration. For example, as shown in FIG. 2A, multiple FDDs 100 may be arranged into two columns 202 and 204 of FDDs 100. Within each of the columns 202 and 204, adjacent FDDs 100 may be oriented differently as shown. In some embodiments, the FDDs 100 may be arranged with their longitudinal axes substantially in parallel. In some embodiments, the FDDs 100 may not be arranged with their longitudinal axes substantially in parallel. For example, a first group may include multiple FDDs 100 arranged with their longitudinal axes substantially in parallel, while a second group may include multiple FDDs 100 arranged with their longitudinal axes substantially in parallel but oriented differently from the longitudinal axes of the first group. Any desired arrangement of FDDs 100 in an array 200 may be used.

In some embodiments, the FDDs 100 in the array 200 may be arranged so as not to contact the solder bumps or balls 208. In some embodiments, the FDDs 100 or the solder bumps or balls 208 may be coated with an insulating material, and thus contact between the FDDs 100 and the solder bumps or balls 208 may be tolerable without significant risk of an electrical short.

Coolant may be directed across the array 200 in any desired direction. For example, in various embodiments, coolant may flow in the direction indicated by the arrow 250, the direction indicated by the arrow 252, the direction indicated by the arrow 254, and/or the direction indicated by the arrow 256. In various embodiments, coolant may flow in different directions proximate to different regions of the array 200. For example, coolant may flow in the direction indicated by the arrow 254 proximate to the row 202, and in the direction indicated by the arrow 256 proximate to the row 204. In some embodiments, coolant may flow toward the first face 110 of the FDD 100 (e.g., in the direction indicated by the arrow 258) and/or toward the second face 112 of the FDD 100 (e.g., in the direction indicated by the arrow 260).

Figure 3A:
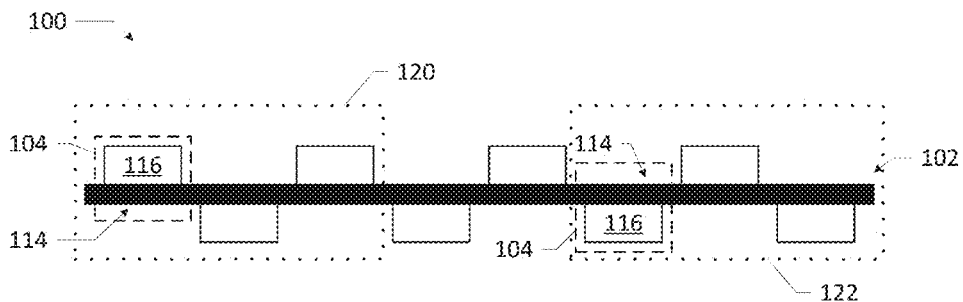
FIGS. 3A-3C illustrate the deformation of the first FDD embodiment (FIGS. 1A-1C) in response to various thermal conditions, in accordance with various embodiments.
Figure 3B:
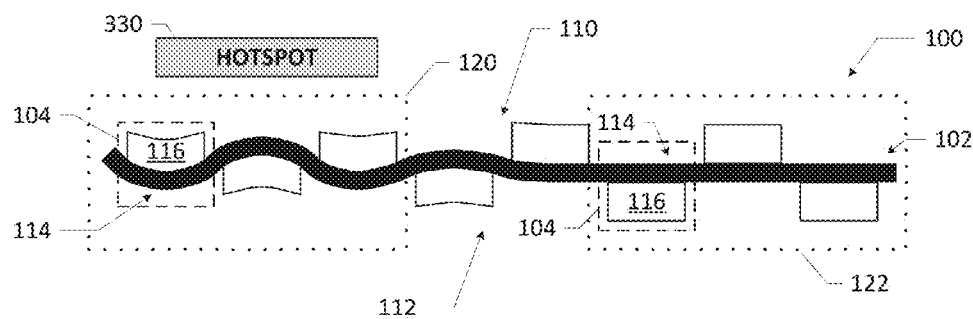
Figure 3C:
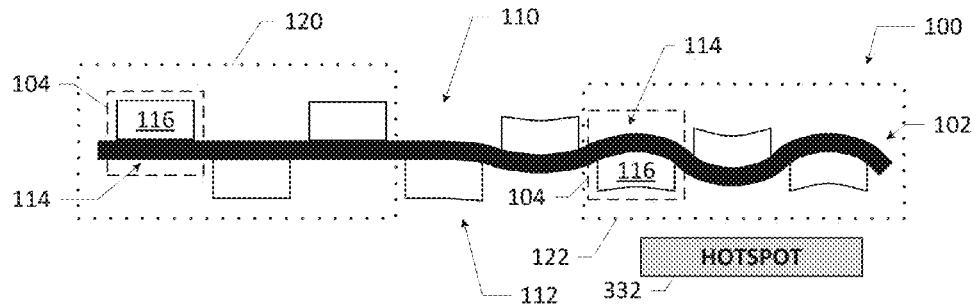

FIGS. 3A-3C illustrate the deformation of the FDD 100 in response to various thermal conditions, in accordance with various embodiments. For the purposes of illustration, the embodiment of the FDD 100 shown in FIGS. 3A-3C may include a thermally conductive body material which is a same material as the first material 114 of the fins 104, and may include a second material 116 of the fins 104 that has a lower CTE than the CTE of the first material 114. FIG. 3A depicts the FDD 100 in a low temperature state (e.g., under thermal conditions in which no hotspots are proximate to the FDD 100). Since thermal conditions are approximately uniform and low temperature in the area around the FDD 100, various collections of the fins 104 (such as the collections 120 and 122 illustrated in FIG. 3A) may exhibit approximately the same behavior; as shown in FIG. 3A, none of the fins 104 may significantly deform from their low temperature configurations.

FIG. 3B depicts the FDD 100 under thermal conditions in which a hotspot 330 is located closer to the collection 120 than the collection 122. Heat from the hotspot 330 may cause the first material 114 of the fins 104 in the collection 120 to expand. Heat from the hotspot 330 may also cause the second material 116 of the fins 104 in the collection 120 to expand; however, because the CTE of the second material 116 is lower than the CTE of the first material 114, the second material 116 may not expand as much as a corresponding amount of the first material 114. This may cause the fins 104 of the collection 120 to deform by curving around the lower CTE material (in this case, the second material 116). As shown in FIG. 3B, heat from the hot spot 330 may be transferred to both the second material 116 of fins 104 extending from the first face 110 of the FDD 100 as well as to the second material 116 of fins 104 extending from the second face 112 of the FDD 100. In some embodiments, depending upon the relative position of the hotspot 330 and the FDD 100, as well as on the thermal conductivity of the body material, heat may be partially or substantially blocked from reaching the second material 116 of fins 104 extending from the second face 112. In such embodiments, heat from the hotspot 330 may not cause the second material 116 of the fins 104 extending from the second face 112 to expand.

The fins 104 in the collection 122 may undergo some deformation due to the heat from the hotspot 330, but because the collection 122 is located farther from the hotspot 330 than the collection 120, the fins 104 in the collection 122 may deform from their low temperature configurations to a different (lesser) degree than the fins 104 in the collection 120. The degree of deformation of fins in a collection may be characterized by an average change in curvature (e.g., average change in radius of curvature), a total change in curvature, an average linear distance traveled by the second ends 104b of the fins 104, a total linear distance traveled by the second ends 104b of the fins 104, or any suitable aggregate measure of deformation.

FIG. 3C depicts the FDD 100 under thermal conditions in which a hotspot 332 is located closer to the collection 122 than the collection 120. Heat from the hotspot 332 may cause the first material 114 of the fins 104 in the collection 122 to expand. Heat from the hotspot 332 may also cause the second material 116 of the fins 104 in the collection 122 to expand; however, because the CTE of the second material 116 is lower than the CTE of the first material 114, the second material 116 may not expand as much as a corresponding amount of the first material 114, and the fins 104 of the collection 122 may deform by curving around the lower CTE material (the second material 116), as discussed above with reference to FIG. 3B. The behavior of the fins 104 in the collection 122 under the thermal conditions of FIG. 3C may be analogous to those discussed above with reference to the behavior of the fins 104 in the collection 120 under the thermal conditions of FIG. 3B. The fins 104 in the collection 120 may undergo some deformation due to the heat from the hotspot 332, but because the collection 120 is located farther from the hotspot 332 than the collection 122, the fins 104 in the collection 120 may deform to a different (lesser) degree than the fins 104 in the collection 122.

If either of the hotspots 330 or 332 of FIGS. 3B and 3C, respectively, were to cool, the FDD 100 may "relax" back to the configuration shown in FIG. 3A. In this manner, the FDD 100 may deform in response to local hotspots, with fins proximate to the hotspots deforming to a greater degree than fins farther away from the hotspots, and this deformation may be dynamic as hotspots move (e.g., during operation of an IC device).

FIGS. 4A-4D illustrate the diversion of flowing coolant, in response to various thermal conditions, between two IC components 402 and 404 of an IC device that includes the FDD 100, in accordance with various embodiments. As shown in FIGS. 4A-4D, the FDD 100 may be included in a channel between a first component 402 and a second component 404. The first component 402 and the second component 404 may be dies or packages, for example. A coolant may be circulated through the area between the first component 402 and the second component 404 and around the FDD 100. For illustrative purposes, the coolant flow is indicated by flow lines oriented from right to left, representative of the circulation of coolant from the right to the left. The circulation of coolant in any of the embodiments discussed herein may be controlled by one or more pumps, distribution pipes or channels, heat exchangers, or other components of existing coolant circulation technology (not shown for ease of illustration), but discussed below with reference to FIG. 21. Although FIGS. 4A-4D (and other figures) illustrate coolant flowing from right to left, coolant may flow in any desired direction or directions in any of the embodiments disclosed herein (e.g., as discussed above with reference to FIGS. 2A and 2B).

FIG. 4A depicts the flow of coolant around the FDD 100 at low temperature (e.g., under thermal conditions in which no hotspots are proximate to the FDD 100). The configuration of the FDD 100 under these thermal conditions may be substantially the same as discussed above with reference to FIG. 3A. In particular, the flow of coolant may be turbulent local to the fins 104, but coolant may flow in a substantially similar manner proximate to the collection 120 and proximate to the collection 122.

FIG. 4B depicts the flow of coolant around the FDD 100 under thermal conditions in which a hotspot 414 is located closer to the collection 120 than the collection 122. The configuration of the FDD 100 under these thermal conditions may be substantially the same as discussed above with reference to FIG. 3B. In particular, the fins 104 of the collection 120 may deform to a greater degree than the fins 104 of the collection 122. This may cause the coolant to undergo more turbulence in a region proximate to the collection 120 than in a region proximate to the collection 122. This increased turbulence proximate to the hotspot 414 may result in increased heat transfer from the hotspot 414 to the coolant.

FIG. 4C depicts the flow of coolant around the FDD 100 under thermal conditions after the hotspot 414 has cooled (e.g., because devices included in the first component 402 have been deactivated or are otherwise not in use). In response to the cooling of the hotspot 414, the FDD 100 may deform from its configuration in FIG. 4B and return to the configuration of FIG. 4A.

FIG. 4D depicts the flow of coolant around the FDD 100 under thermal conditions in which a hotspot 416 is located closer to the collection 122 than the collection 120. The configuration of the FDD 100 under these thermal conditions may be substantially the same as discussed above with reference to FIG. 3C. In particular, the fins 104 of the collection 122 may deform to a greater degree than the fins 104 of the collection 120. This may cause the coolant to undergo more turbulence in a region proximate to the collection 122 than in a region proximate to the collection 120. This increased turbulence may result in increased heat transfer from the hotspot 416 to the coolant. If the hotspot 416 cools, the FDD 100 may deform from its configuration in FIG. 4D and return to the configuration shown in FIGS. 4A and 4C.

Figure 5A:
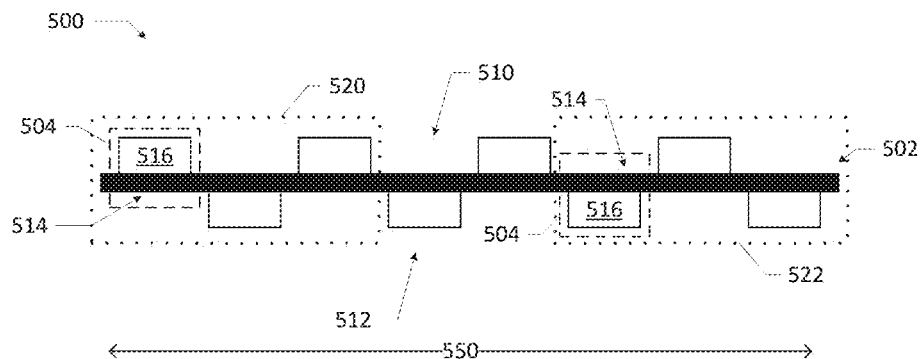
FIGS. 5A-5C illustrate a second FDD embodiment and its deformation in response to various thermal conditions, in accordance with various embodiments.
Figure 5B:
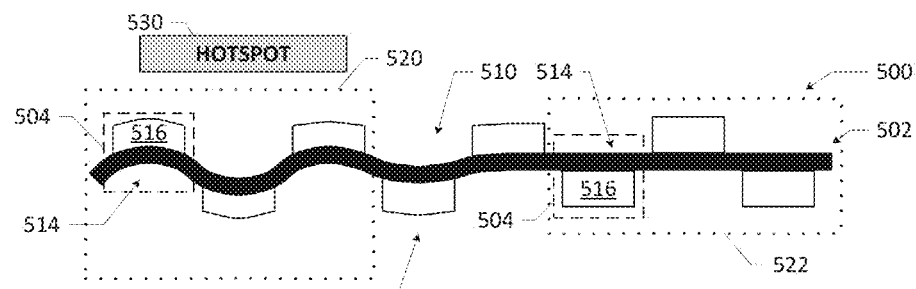
Figure 5C:
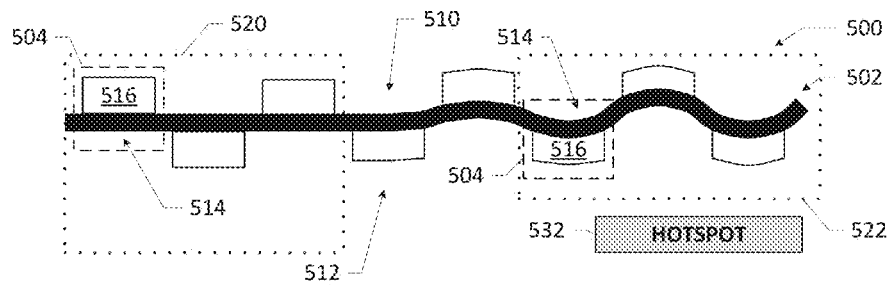

FIGS. 5A-5C illustrate an FDD embodiment 500 and its deformation in response to various thermal conditions, in accordance with various embodiments. The FDD 500 may include a body 502 (including a body material) and one or more thermally deformable fins 504 arranged along the body 502. Individual fins 504 may include a first material 514 and a second material 516. The first material 514 may have a different CTE than the second material 516. In the FDD 500, the first material 514 may be a same material as the body material. For example, as shown in FIG. 5A, the first material 514 may be contiguous with the body 502. In some such embodiments, the second material 516 of a fin 504 may extend from the body 502. In the FDD 500, the second material 516 may have a CTE that is higher than a CTE of the first material 514. This may be contrasted with the FDD 100, in which the second material 116 may have a CTE that is lower than a CTE of the first material 114. Different ones of the fins 504 of the FDD 500 may be composed of the same materials, or different ones of the fins 504 may be composed of different materials (e.g., different first materials 514 and/or different second materials 516). The FDD 500 may have a longitudinal axis 550.

The arrangement of the fins 504 and the materials that may be used in the fins 504 may take the form of any of the corresponding elements described above (e.g., with reference to the FDD 100). In some embodiments, the FDD 500 may include an attachment portion (not shown). This attachment portion may take the form of any of the attachment portions described herein (e.g., the attachment portion 102a described above with reference to the FDD 100). Multiple ones of the FDD 500 may be arranged in an array, which may be included in an IC device. This array may take the form of any of the embodiments described above with reference to the array 200 of FIGS. 2A-2B, for example.

FIG. 5A depicts the FDD 500 in a low temperature state (e.g., under thermal conditions in which no hotspots are proximate to the FDD 500). Since thermal conditions are approximately uniform in the area around the FDD 500, various collections of the fins 504 (such as the collections 520 and 522 illustrated in FIG. 5A) may exhibit approximately the same behavior; as shown in FIG. 5A, none of the fins 504 may significantly deform from their low temperature configurations.

FIGS. 5B-5C illustrate the deformation of the FDD 500 in response to various thermal conditions, in accordance with various embodiments. For the purposes of illustration, the embodiment of the FDD 500 shown in FIGS. 5B-5C may include a thermally conductive first material 514 and a second material 516 of the fins 504 that has a higher CTE than the CTE of the first material 514.

FIG. 5B depicts the FDD 500 under thermal conditions in which a hotspot 530 is located closer to the collection 520 than the collection 522. Heat from the hotspot 530 may cause the second material 516 of the fins 504 in the collection 520 to expand. Heat from the hotspot 530 may also cause the first material 514 of the fins 504 in the collection 520 to expand; however, because the CTE of the first material 514 is lower than a CTE of the second material 516, the first material 514 may not expand as much as a corresponding amount of the second material 516. This may cause the fins 504 of the collection 520 to deform by curving around the lower CTE material (in this case, the first material 514). As shown in FIG. 5B, heat from the hot spot 530 may be transferred to the second material 516 of fins 504 extending from the first face 510 of the FDD 500 as well as to the second material 516 of fins 504 extending from the second face 512 of the FDD 500. In some embodiments, heat may be partially or substantially blocked from reaching the second material 516 of fins 504 extending from the second face 512, as discussed above with reference to FIG. 3B. In such embodiments, heat from the hotspot 530 may not cause the second material 516 of the fins 504 extending from the second face 512 to expand (or may cause them to expand to a lesser degree than fins 504 extending from the first face 510).

The fins 504 in the collection 522 may undergo some deformation due to the heat from the hotspot 530, but because the collection 522 is located farther from the hotspot 530 than the collection 520, the fins 504 in the collection 522 may deform to a different (lesser) degree than the fins 504 in the collection 520.

FIG. 5C depicts the FDD 500 under thermal conditions in which a hotspot 532 is located closer to the collection 522 than the collection 520. Heat from the hotspot 532 may cause the second material 516 of the fins 504 in the collection 522 to expand. Heat from the hotspot 532 may also cause the first material 514 of the fins 504 in the collection 522 to expand; however, because the CTE of the first material 514 is lower than a CTE of the second material 516, the first material 514 may not expand as much as a corresponding amount of the second material 516, and the fins 504 of the collection 522 may deform by curving around the lower CTE material (the first material 514), as discussed above with reference to FIG. 5B. The behavior of the fins 504 of the collection 522 under the thermal conditions of FIG. 5C may be analogous to those discussed above with reference to the behavior of the fins 504 of the collection 520 under the thermal conditions of FIG. 5B. In particular, the fins 504 in the collection 520 may undergo some deformation due to the heat from the hotspot 532, but because the collection 520 is located farther from the hotspot 532 than the collection 522, the fins 504 in the collection 520 may deform to a different (lesser) degree than the fins 504 in the collection 522.

As discussed above with reference to FIGS. 3B and 3C, if either of the hotspots 530 or 532 of FIGS. 5B and 5C, respectively, were to cool, the FDD 500 may "relax" back to the configuration shown in FIG. 5A, thereby exhibiting dynamic deformation in response to changes in thermal conditions.

In some embodiments, the FDD 500 may be included in an IC device and may divert flowing coolant in a manner similar to that illustrated in FIGS. 4A-4D. In particular, fins 504 of the FDD 500 located closer to a hotspot than other fins may deform to a greater degree than the other fins and thereby cause more local turbulence in a coolant. This local turbulence may increase the transfer of heat between the hotspot and the coolant relative to the transfer of heat between other areas of the IC device and the coolant. The turbulence patterns induced by deformation of the FDD 500 may be different from the turbulence patterns induced by deformation of the FDD 100 due to the different construction and deformation geometry of the FDDs, 100 and 500, but the FDD 500 may result in analogous flow diversion effects as those shown in FIGS. 4A-4D.

Figure 6A:
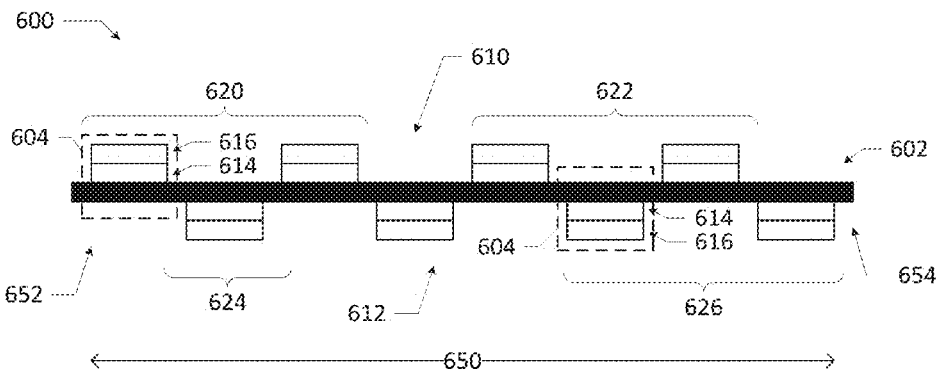
FIGS. 6A-6C illustrate a third FDD embodiment and its deformation in response to various thermal conditions, in accordance with various embodiments.
Figure 6B:
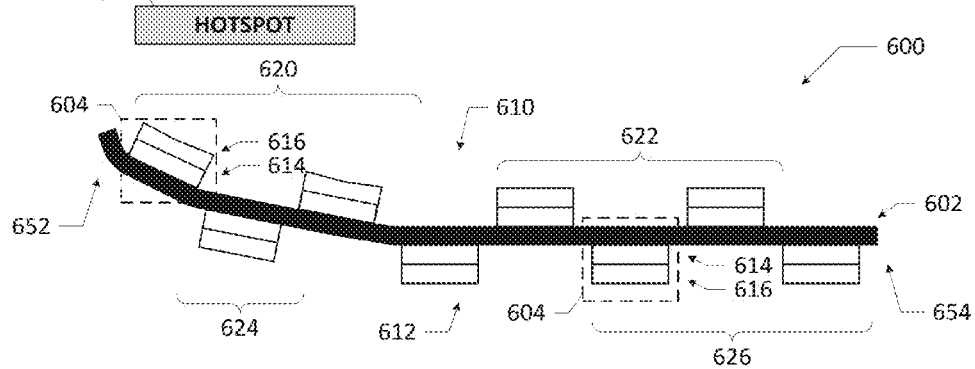
Figure 6C:
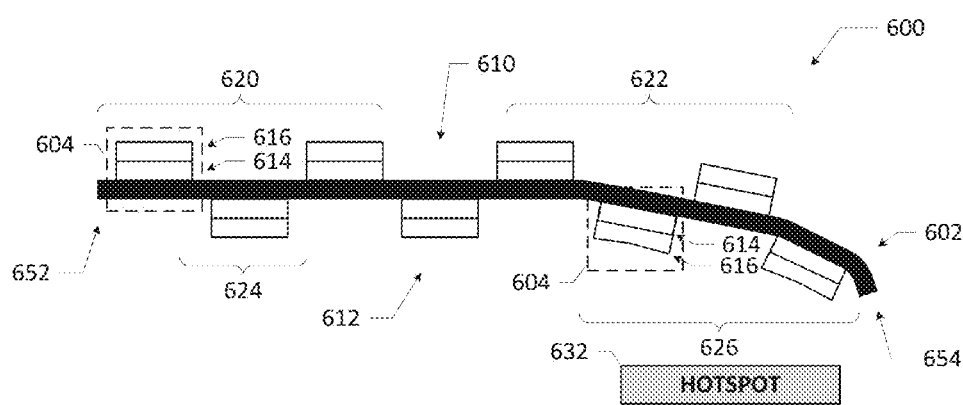

FIGS. 6A-6C illustrate an FDD embodiment 600 and its deformation in response to various thermal conditions, in accordance with various embodiments. The FDD 600 may include a body 602 (including body material) and one or more thermally deformable fins 604 arranged along the body 602. Individual fins 604 may include a first material 614 and a second material 616. The first material 614 may have a different CTE than the second material 616. In the FDD 600, the first material 614 may be a different material than the body material. In some embodiments, the first material 614 may extend from the body 602, and may be disposed between the second material 616 and the body 602. In some such embodiments, the second material 616 of a fin 604 may extend from the first material 614, and may also contact the body 602 (not shown).

The relationships between the CTEs of the body material, the first material 614 and the second material 616 may take any of a number of forms. Examples of such relationships are now discussed with reference to the FDD 600, but these relationships may be applied to any of the embodiments disclosed herein. In some embodiments, the body material may be a thermal insulator and the first material 614 and the second material 616 may have CTEs greater than a CTE of the body material. In some embodiments, the body material (e.g., a thermal insulator) may have sufficient elasticity to accommodate the dynamic deformation of the first material 614 of the fins 604 under various thermal conditions. In some embodiments, the CTE of the first material 614 may be greater than a CTE of the second material 616. In some embodiments, the CTE of the first material 614 may be less than the CTE of the second material 616. Various combinations of materials with different CTEs may be used in the FDD 600 to achieve desired thermal responses of the FDD 600. For example, in embodiments in which the body material is a thermal insulator, heat may not be readily transferred from a hotspot located proximate to a first face 610 of the FDD 600 to the fins 604 extending from a second face 612 of the FDD 600. This may result in selective deformation of fins extending from one face or the other depending on whether the hotspot is located proximate to one face or the other. In some embodiments, greater deformation of a fin 604 (when exposed to heat) may be achieved by increasing the difference in CTE between the body material and the first material 614 and/or between the first material 614 and a second material 616. In some embodiments, lesser deformation may be desired, and thus smaller differences in CTE between adjacent materials may be preferred. The amount of desired deformation under various thermal conditions may determine the choice of materials and/or the geometry of the fins 604 (and the fins of any of the other FDDs disclosed herein) in accordance with physical principles. Different ones of the fins 604 of the FDD 600 may be composed of the same materials, or different ones of the fins 604 may be composed of different materials (e.g., different first materials 614 and/or different second materials 616).

In some embodiments, the FDD 600 may include an attachment portion (not shown). This attachment portion may take the form of any of the attachment portions described herein (e.g., the attachment portion 102a described above with reference to the FDD 100). Multiple ones of the FDD 600 may be arranged in an array, which may be included in an IC device. This array may take the form of any of the embodiments described above with reference to the array 200 of FIGS. 2A-2B, for example. The FDD 600 may have a longitudinal axis 650, and may have longitudinal ends 652 and 654.

FIG. 6A depicts the FDD 600 in a low temperature state (e.g., under thermal conditions in which no hotspots are proximate to the FDD 600). Since thermal conditions are approximately uniform in the area around the FDD 600, various collections of the fins 604 (such as the collections 620, 622, 624 and 626) may exhibit approximately the same behavior; as shown in FIG. 6A, none of the fins 604 may significantly deform from their low temperature configuration.

FIGS. 6B-6C illustrate the deformation of the FDD 600 in response to various thermal conditions, in accordance with various embodiments. For illustrative purposes, the FDD 600 will be discussed below as having a body 602 formed from a body material that is a thermal insulator, and as having fins 604 with the first material 614 having a higher CTE than the second material 616. However, other embodiments (such as those discussed above with reference to FIG. 6A) may exhibit analogous behavior under various thermal conditions.

FIG. 6B depicts the FDD 600 under thermal conditions in which a hotspot 630 is located closer to the collection 620 than the collections 622, 624 and 626. Heat from the hotspot 630 may cause the first material 614 of the fins 604 in the collection 620 to expand. Heat from the hotspot 630 may also cause the second material 616 of the fins 604 in the collection 620 to expand; however, because the CTE of the second material 616 is lower than a CTE of the first material 614, the second material 616 may not expand as much as a corresponding amount of the first material 614. This may cause the fins 604 of the collection 620 to deform by curving around the lower CTE material (in this case, the second material 616). Because the body 602 is formed from a thermal insulator, heat from the hotspot 630 may be partially or substantially blocked from reaching the collections 624 and 626. Consequently, the fins 604 in the collections 624 and 626 may not deform in response to the hotspot 630 (or may not deform to the degree of fins 604 extending from the first face 610 of the FDD 600). The fins 604 in the collection 622 may undergo some deformation due to the heat from the hotspot 630, but because the collection 622 is located farther from the hotspot 630 than the collection 620, the fins 604 in the collection 622 may deform to a different (lesser) degree than the fins 604 in the collection 620. Because the fins 604 in the collection 620 all may deform in the same direction in response to the hotspot 630, and because the thermally insulating body 602 may limit the heat transfer from the hotspot 630 to the fins 604 in the collection 624 (thereby limiting or preventing the deformation of the fins 604 in the collection 624), the FDD 600 may deform such that the longitudinal end 652 may move toward the hotspot 630. This may be contrasted with the behavior of other FDD embodiments, such as the FDDs 100 and 500, which may "undulate" in a portion proximate to a hotspot.

FIG. 6C depicts the FDD 600 and under thermal conditions in which a hotspot 632 is located closer to the collection 626 than the collections 620, 622 and 624. Heat from the hotspot 632 may cause the first material 614 of the fins 604 in the collection 626 to expand. Heat from the hotspot 632 may also cause the second material 616 of the fins 604 in the collection 626 to expand; however, because the CTE of the second material 616 is lower than a CTE of the first material 614, the second material 616 may not expand as much as a corresponding amount of the first material 614, and the fins 604 of the collection 626 may deform by curving around the lower CTE material (the second material 616), as discussed above with reference to FIG. 6B. The behavior of the fins 604 in the collection 626 under the thermal conditions of FIG. 6C may be analogous to those discussed above with reference to the behavior of the fins 604 in the collection 620 under the thermal conditions of FIG. 6B. In particular, the fins 604 in the collections 620 and 622 may not deform in response to the hotspot 632 (or may not deform to the degree of fins 604 extending from the second face 612 of the FDD 600) due to the presence of the thermally insulating body 602. The fins 604 in the collection 624 may undergo some deformation due to the heat from the hotspot 632, but because the collection 624 is located farther from the hotspot 632 than the collection 626, the fins 604 in the collection 624 may deform to a different (lesser) degree than the fins 604 in the collection 626. Because the fins 604 in the collection 626 all may deform in the same direction in response to the hotspot 632, and because the thermally insulating body 602 limits the heat transfer from the hotspot 632 to the fins 604 in the collection 622 (thereby limiting or preventing the deformation of the fins 604 in the collection 622), the FDD 600 may deform such that the longitudinal end 654 may move toward the hotspot 632.

FIGS. 7A-7D illustrate the diversion of flowing coolant, in response to various thermal conditions, between two IC components 402 and 404 of an IC device that includes the FDD 600, in accordance with various embodiments. As discussed above with reference to FIGS. 4A-4D, a coolant may be circulated through the area between the first component 402 and the second component 404 and around the FDD 600.

Figure 7A:
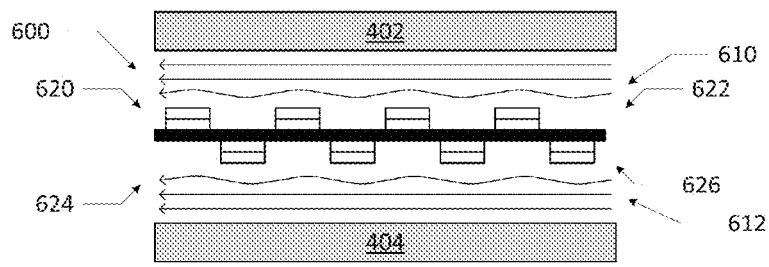
FIGS. 7A-7D illustrate the diversion of flowing coolant, in response to various thermal conditions, in an IC device that includes the third FDD embodiment (FIGS. 6A-6C), in accordance with various embodiments.

FIG. 7A depicts the flow of coolant around the FDD 600 in a low temperature state (e.g., under thermal conditions in which no hotspots are proximate to the FDD 600). The configuration of the FDD 600 under these thermal conditions may be substantially the same as discussed above with reference to FIG. 6A. In particular, the flow of coolant may be turbulent local to the fins 604, but coolant may flow in a substantially similar manner between the first face 610 of the FDD 600 and the first component 402 and between the second face 612 of the FDD 600 and the second component 404.

Figure 7B:
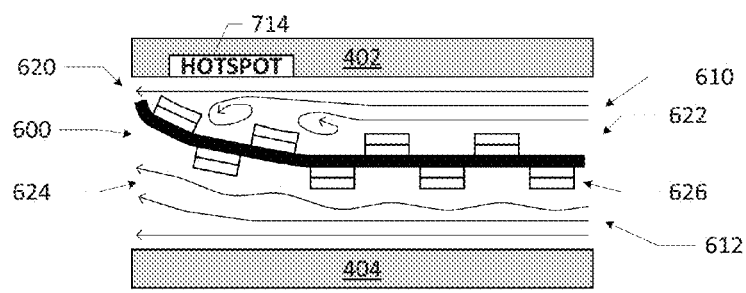

FIG. 7B depicts the flow of coolant around the FDD 600 under thermal conditions in which a hotspot 714 is located closer to the collection 620 than the collections 622, 624 and 626. The configuration of the FDD 600 under these thermal conditions may be substantially the same as discussed above with reference to FIG. 6B. In particular, the fins 604 of the collection 620 may deform to a greater degree than the fins 604 of the collections 622, 624 and 626. The net result of the deformation of various ones of the fins 604 may be the deformation of the FDD 600 so as to deform toward the hotspot 714 in a portion proximate to the fins 604 of the collection 620. This may cause the coolant to undergo more turbulence in a region proximate to the collection 620 than in other regions, and/or may force a higher rate of coolant flow proximate to the hotspot 714. This increased turbulence and/or flow rate may result in increased heat transfer from the hotspot 714 to the coolant.

Figure 7C:
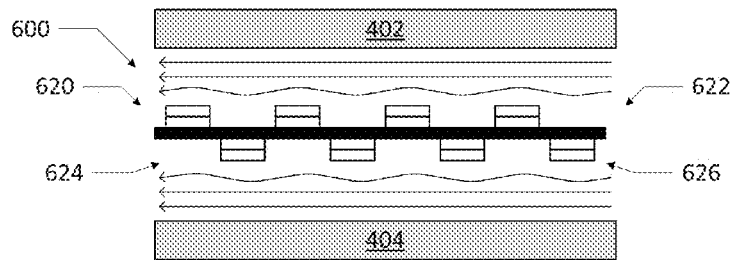

FIG. 7C depicts the flow of coolant around the FDD 600 under thermal conditions after the hotspot 714 has cooled. In response to the cooling of the hotspot 714, the FDD 600 may deform from its configuration in FIG. 7B and return to the configuration of FIG. 7A.

Figure 7D:
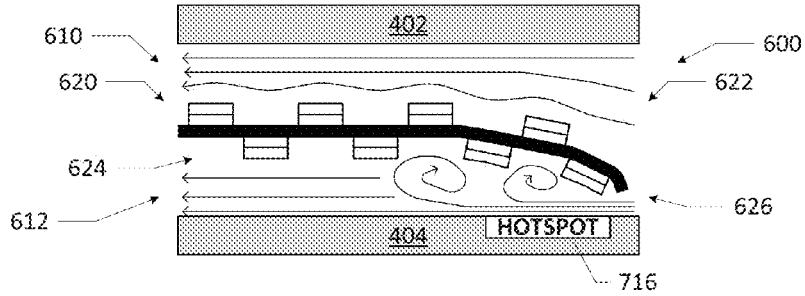

FIG. 7D depicts the flow of coolant around the FDD 600 under thermal conditions in which a hotspot 716 is located closer to the collection 626 than the collections 620, 622 and 624. The configuration of the FDD 600 under these thermal conditions may be substantially the same as discussed above with reference to FIG. 6C. In particular, the fins 604 of the collection 626 may deform to a greater degree than the fins 604 of the collections 620, 622 and 624. The net result of the deformation of various ones of the fins 604 may be the deformation of the FDD 600 so as to deform toward the hotspot 716 in a portion proximate to the fins 604 of the collection 626. This may cause the coolant to undergo more turbulence in a region proximate to the collection 626 than other regions, and/or may force a higher rate of coolant flow proximate to the hotspot 716. This increased turbulence and/or flow rate proximate to the hotspot 716 may result in increased heat transfer from the hotspot 716 to the coolant. After the hotspot 716 has cooled, the FDD 600 may deform from its configuration in FIG. 7D and return to the configuration shown in FIGS. 7A and 7C.

Figure 8A:
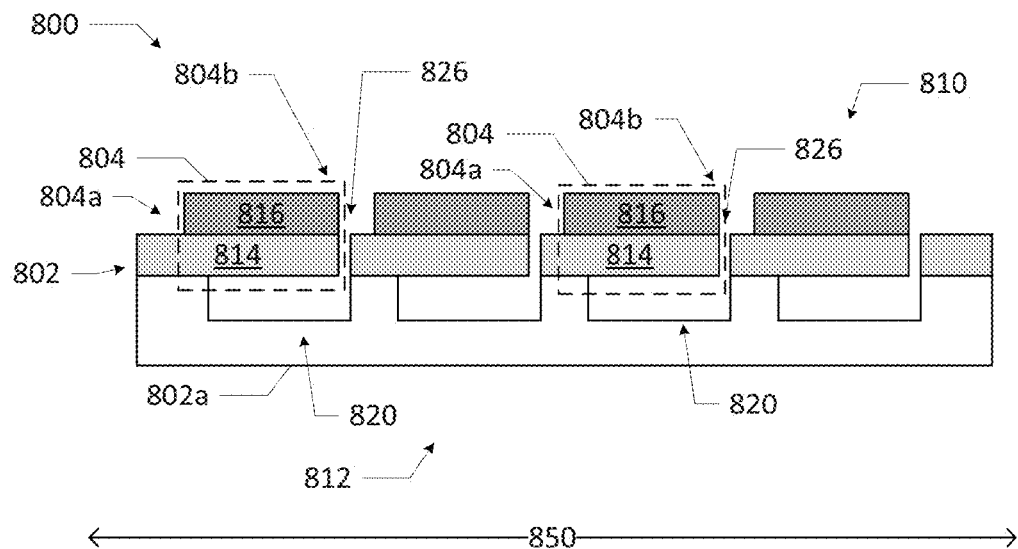
FIGS. 8A-8B are various views of a fourth FDD embodiment in a low temperature state.
Figure 8B:
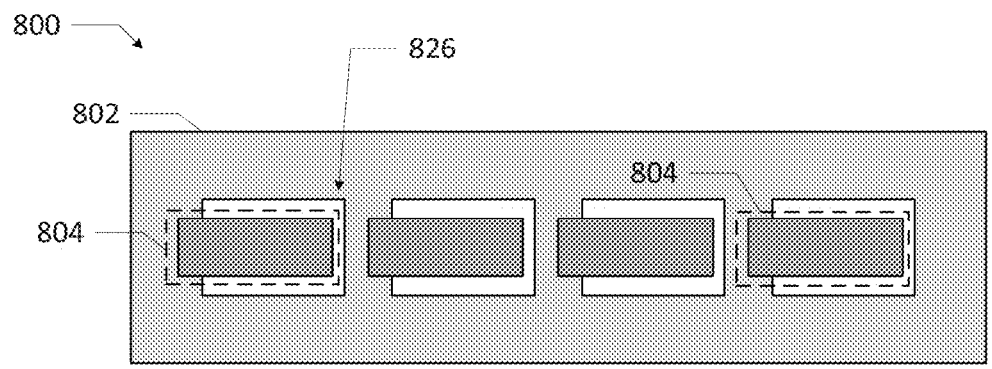

FIGS. 8A-8B are various views of an embodiment 800 of an FDD. FIG. 8A is a side view of the FDD 800 and FIG. 8B is a top view of the FDD 800. The FDD 800 may include a body 802 (including a body material) and one or more thermally deformable fins 804 arranged along the body 802. Individual fins 804 may include a first material 814 and a second material 816. The first material 814 may have a different CTE than the second material 816. In various embodiments, a fin 804 may include three or more materials having same or different CTEs.

In some embodiments, the first material 814 may be a same material as the body material. For example, as shown in FIG. 8A, the first material 814 may be contiguous with the body 802. In some such embodiments, the second material 816 of a fin 804 may extend from the body 802, and may have a CTE that is lower than a CTE of the first material 814. Embodiments in which the CTE of the second material 816 of a fin 804 is higher than a CTE of the first material 814 are discussed below (e.g., with reference to FIGS. 12A-12B). The body 802 may include multiple apertures 826, into which the fins 804 may extend.

The FDD 800 may have a first face 810 and a second face 812 opposite the first face 810. One or more of the fins 804 may extend from the first face 810. In some embodiments, no fins 804 may extend from the second face 812. In other embodiments, one or more fins 804 may extend from the second face 812 (e.g., as discussed below with reference to FIGS. 15A-15C. Different ones of the fins 804 of the FDD 800 may be composed of the same materials, or different ones of the fins 804 may be composed of different materials (e.g., different first materials 814 and/or different second materials 816). Each fin 804 may include a first end 804a and a second end 804b. The first end 804a may be secured to the body 802, as shown. The second end 804b may not be secured to the body 802, but may extend away from the body 802. The FDD 800 may have a longitudinal axis 850.

In some embodiments, the body 802 may include an attachment portion 802a. The attachment portion 802a may be used to secure the FDD 800 to a portion of an IC device. In FIG. 8A, the attachment portion 802a is depicted as a material having multiple cavities 820 located below corresponding fins 804. The ends 804b of the fins 804 may extend over corresponding apertures 826. In some embodiments, the material of the attachment portion 802a may be a dielectric substrate. In some embodiments, the body 802 may not include the attachment portion 802a of FIG. 8A. In some such embodiments, the body 802 may be secured to a surface of an IC component (e.g., by soldering or adhesive) without an intervening layer of dielectric material securing as the attachment portion 102a. In some embodiments, the attachment portion 802a may take the form shown in FIG. 1C (or any of the forms discussed above) for the attachment portion 102a. For example, in some embodiments, the attachment portion 802a may not include legs or feet or a dielectric substrate, but may instead be a soldered or adhesive connection between one or more locations along the body 802 and a surface of a portion of an IC device. Any other structure used to secure the FDD 800 to a portion of an IC device may be used in various embodiments.

Figure 9A:
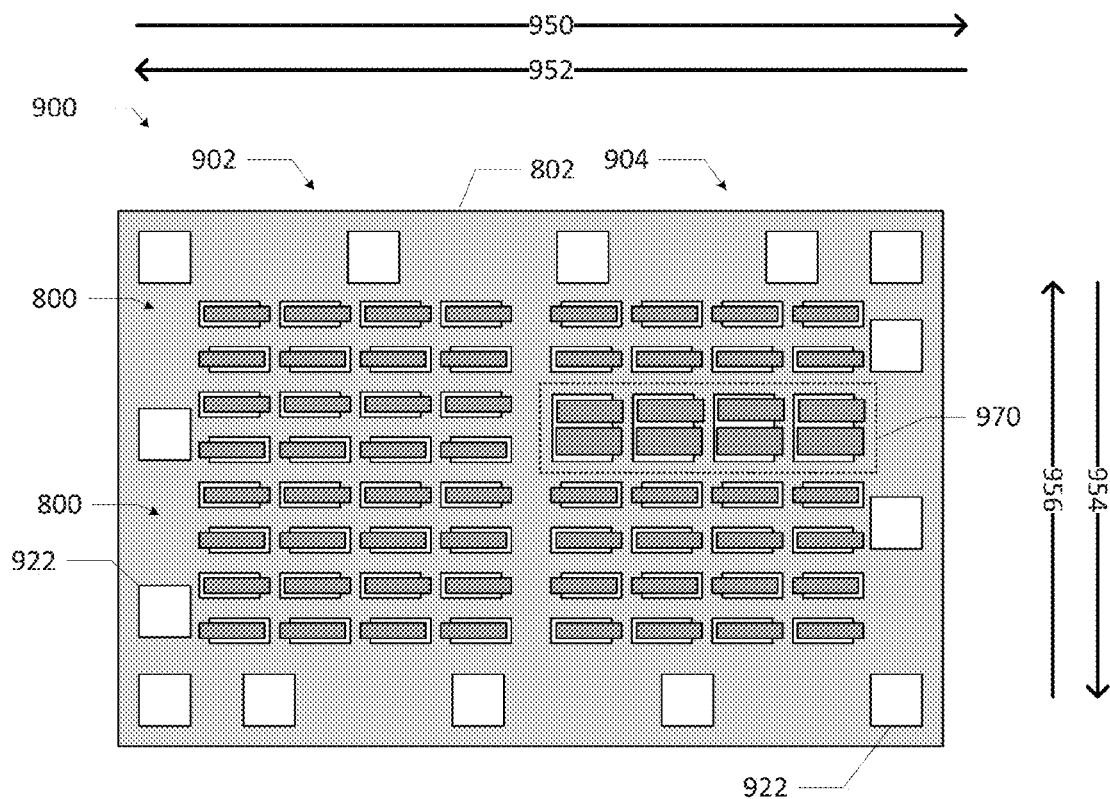
FIGS. 9A-9B are various views of multiple ones of the fourth FDD embodiment (FIGS. 8A-8B) arranged in an array included in an IC device, in accordance with various embodiments.
Figure 9B:
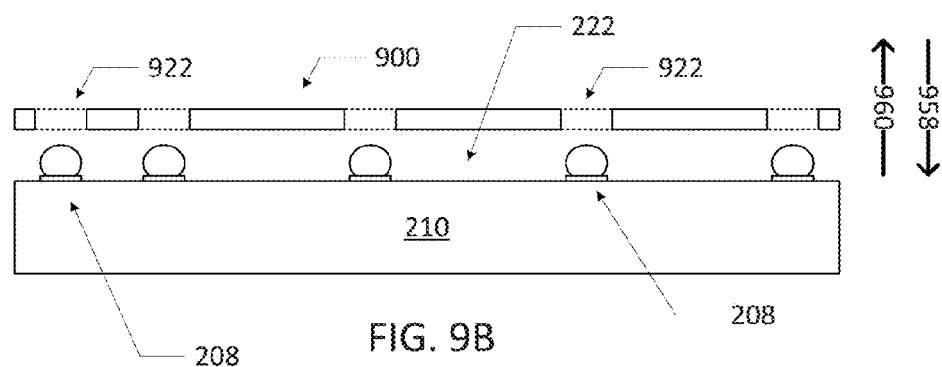

FIGS. 9A-9B are various views of multiple ones of the FDD 800 arranged in an array 900 disposed on the surface 222 of the IC component 210, in accordance with various embodiments. FIG. 9A is a top view of the array 900 disposed on the surface 222 of the IC component 210, and FIG. 9B is an exploded side view of the array 900 disposed on the surface 222. The IC component 210 and the surface 222 may take any of the forms discussed above with reference to FIGS. 2A-2B, for example. One or more solder bumps or balls 208 may be disposed on the surface 222, which may be used to provide connections between the IC component 210 and other dies or packages (not shown).

The array 900 may include two or more FDDs 800, which may be arranged in any desired configuration. For example, as shown in FIG. 9A, multiple FDDs 800 may be arranged into columns (such as the columns 902 and 904). Within each of the columns, adjacent FDDs 800 may be oriented in substantially the same way or may be oriented differently within columns or across columns. For example, any of the variations in orientation discussed above with reference to FIGS. 2A-2B, or any desired orientations, may be used. In some embodiments, the cavities 820 of adjacent FDDs 800 may be unitary (e.g., as illustrated for the group 970 of FDDs 800 of FIG. 9A).

In some embodiments, the body 802 may include one or more apertures 922 dimensioned and located so as to allow the solder bumps or balls 208 to pass through the body 802 without contacting the body 802 and/or any of the fins 804. In some embodiments, the body 802 may be secured to the surface 222 of the IC component 210 with an adhesive or other mechanism.

Coolant may be directed across the array 900 in any desired direction. For example, in various embodiments, coolant may flow in the direction indicated by the arrow 950, the direction indicated by the arrow 952, the direction indicated by the arrow 954, and/or the direction indicated by the arrow 956. In various embodiments, coolant may flow in different directions proximate to different regions of the array 900. For example, coolant may flow in the direction indicated by the arrow 954 proximate to the row 902 of FDDs 800, and in the direction indicated by the arrow 956 proximate to the row 904 of FDDs 800. In some embodiments, coolant may flow toward the first face 810 of an FDD 800 (e.g., in the direction indicated by the arrow 958) and/or toward the second face 812 of the FDD 800 (e.g., in the direction indicated by the arrow 960).

In some embodiments, coolant may be provided (e.g., via pipes or channels) to the cavities 820. When the fins 804 are in the low temperature state illustrated in FIG. 8A, the coolant may be substantially constrained to flow within the cavities 820 (although coolant may flow out of the cavities 820 via the apertures 826). When the fins 804 deform (e.g., as discussed below with reference to FIGS. 10A-10C, more coolant may escape from the cavities 820, thus changing the local distribution of coolant, as discussed below.

Figure 10A:
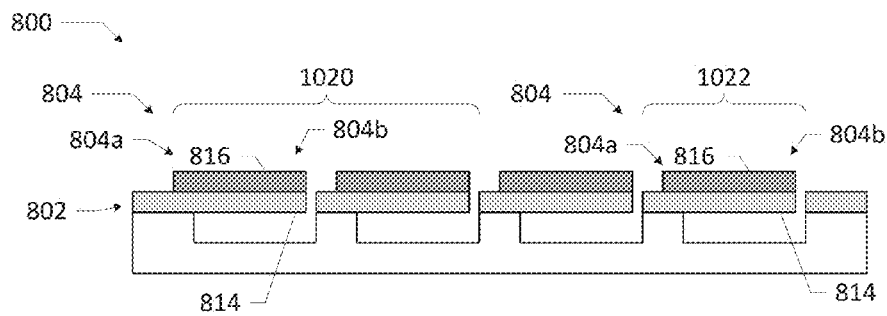
FIGS. 10A-10C illustrate the deformation of the fourth FDD embodiment (FIGS. 8A-8B) in response to various thermal conditions, in accordance with various embodiments.
Figure 10B:
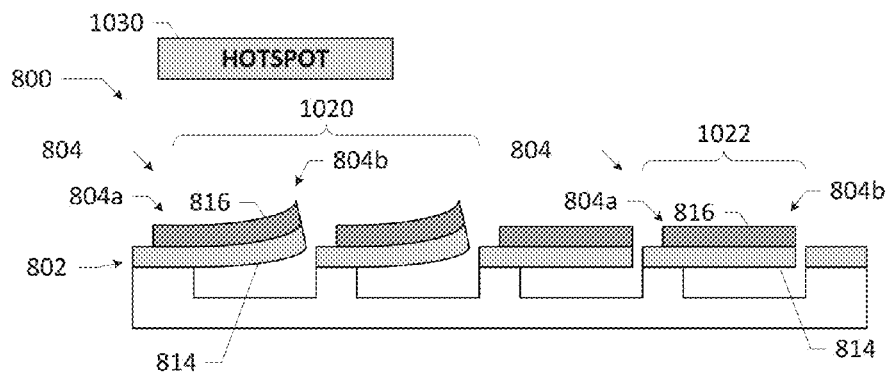
Figure 10C:
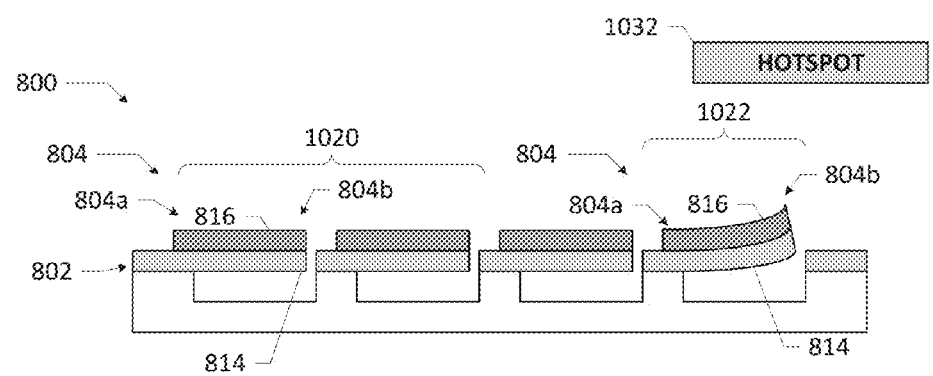

FIGS. 10A-10C illustrate the deformation of the FDD 800 in response to various thermal conditions, in accordance with various embodiments. For the purposes of illustration, the embodiment of the FDD 800 shown in FIGS. 10A-10C may include a second material 816 of the fins 804 that has a lower CTE than a CTE of the first material 814. FIG. 8A depicts the FDD 800 in a low temperature state (e.g., under thermal conditions in which no hotspots are proximate to the FDD 800). Since thermal conditions are approximately uniform in the area around the FDD 800, various collections of the fins 804 (such as the collections 1020 and 1022 illustrated in FIG. 10A) may exhibit approximately the same behavior; as shown in FIG. 10A, none of the fins 804 may significantly deform from their low temperature configurations.

FIG. 10B depicts the FDD 800 under thermal conditions in which a hotspot 1030 is located closer to the collection 1020 than the collection 1022. Heat from the hotspot 1030 may cause the first material 814 of the fins 804 in the collection 1020 to expand. Heat from the hotspot 1030 may also cause the second material 816 of the fins 804 in the collection 1020 to expand; however, because the CTE of the second material 816 is lower than the CTE of the first material 814, the second material 816 may not expand as much as a corresponding amount of the first material 814. This may cause the fins 804 of the collection 1020 to deform by curving around the lower CTE material (in this case, the second material 816). The fins 804 in the collection 1022 may undergo some deformation due to the heat from the hotspot 1030, but because the collection 1022 is located farther from the hotspot 1030 than the collection 1020, the fins 804 in the collection 1022 may deform to a different (lesser) degree than the fins 804 in the collection 1020.

FIG. 10C depicts the FDD 800 under thermal conditions in which a hotspot 1032 is located closer to the collection 1022 than the collection 1020. Heat from the hotspot 1032 may cause the first material 814 of the fins 804 in the collection 1022 to expand. Heat from the hotspot 1032 may also cause the second material 816 of the fins 804 in the collection 1022 to expand; however, because the CTE of the second material 816 is lower than the CTE of the first material 814, the second material 816 may not expand as much as a corresponding amount of the first material 814, and the fins 804 of the collection 1022 may deform by curving around the lower CTE material (the second material 816), as discussed above with reference to FIG. 10B. The behavior of the fins 804 in the collection 1022 under the thermal conditions of FIG. 10C may be analogous to those discussed above with reference to the behavior of the fins 804 in the collection 1020 under the thermal conditions of FIG. 10B. In particular, the fins 804 in the collection 1020 may undergo some deformation due to the heat from the hotspot 1032, but because the collection 1020 is located farther from the hotspot 1032 than the collection 1022, the fins 804 in the collection 1020 may deform to a different (lesser) degree than the fins 804 in the collection 1020.

If either of the hotspots 1030 or 1032 of FIGS. 10B and 10C, respectively, were to cool, the FDD 800 may "relax" back to the configuration shown in FIG. 10A. In this manner, the FDD 800 may deform in response to local hotspots, with fins proximate to the hotspots deforming to a greater degree than fins farther away from the hotspots, and this deformation may be dynamic as hotspots move (e.g., during operation of an IC device).

FIGS. 11A-11D illustrate the diversion of flowing coolant, in response to various thermal conditions, between two IC components 402 and 404 of an IC device that includes the FDD 800, in accordance with various embodiments. As discussed above with reference to FIGS. 4A-4D, a coolant may be circulated through the area between the first component 402 and the second component 404 and around the FDD 800.

Figure 11A:
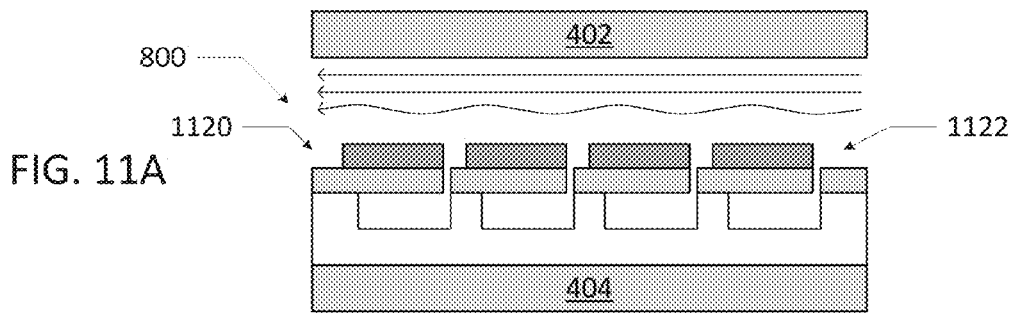
FIGS. 11A-11D illustrate the diversion of flowing coolant, in response to various thermal conditions, in an IC device that includes the fourth FDD embodiment (FIGS. 8A-8B), in accordance with various embodiments.

FIG. 11A depicts the flow of coolant around the FDD 800 in a low temperature state (e.g., under thermal conditions in which no hotspots are proximate to the FDD 800). The configuration of the FDD 800 under these thermal conditions may be substantially the same as discussed above with reference to FIG. 8A. In particular, the flow of coolant may be turbulent local to the fins 804, but coolant may flow in a substantially similar manner across the fins 804 of the collection 1120 and the fins 804 of the collection 1122.

Figure 11B:
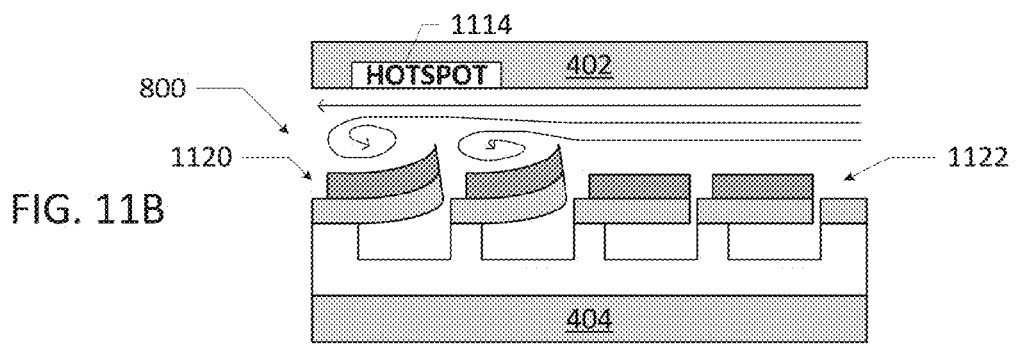

FIG. 11B depicts the flow of coolant around the FDD 800 under thermal conditions in which a hotspot 1114 is located closer to the collection 1120 than the collection 1122. The configuration of the FDD 800 under these thermal conditions may be substantially the same as discussed above with reference to FIG. 10B. In particular, the fins 804 of the collection 1120 may deform to a greater degree than the fins 804 of the collection 1122. This may cause the coolant to undergo more turbulence in a region proximate to the collection 1120 (proximate to the hotspot 1114) than in a region proximate to the collection 1122. This increased turbulence proximate to the hotspot 1114 may result in increased heat transfer from the hotspot 1114 to the coolant.

Figure 11C:
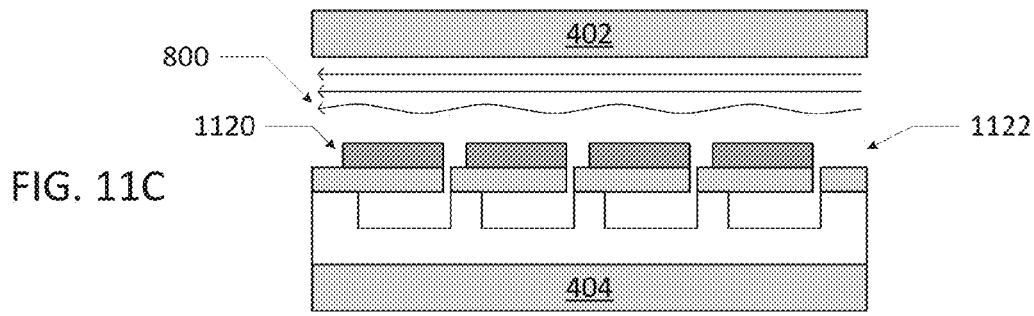

FIG. 11C depicts the flow of coolant around the FDD 800 under thermal conditions after the hotspot 1114 has cooled. In response to the cooling of the hotspot 1114, the FDD 800 may deform from its configuration in FIG. 11B and return to the configuration of FIG. 11A.

Figure 11D:
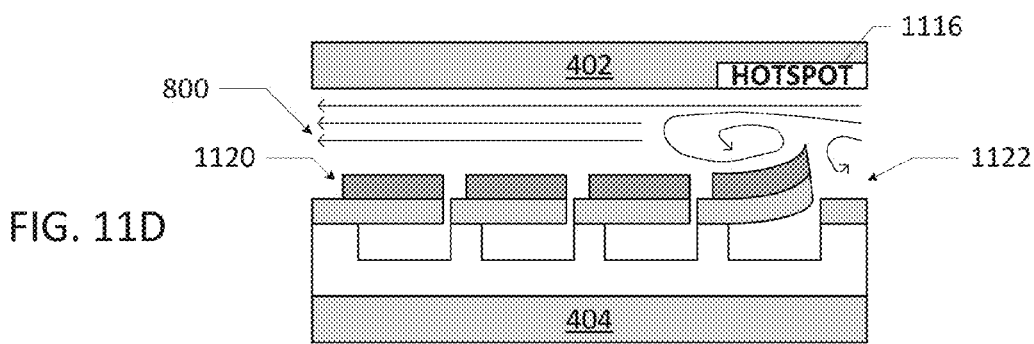

FIG. 11D depicts the flow of coolant around the FDD 800 under thermal conditions in which a hotspot 1116 is located closer to the collection 1122 than the collection 1120. The configuration of the FDD 800 under these thermal conditions may be substantially the same as discussed above with reference to FIG. 10C. In particular, the fins 804 of the collection 1122 may deform to a greater degree than the fins 804 of the collection 1120. This may cause the coolant to undergo more turbulence in a region proximate to the collection 822 than in a region proximate to the collection 1120. This increased turbulence proximate to the hotspot 1116 may result in increased heat transfer from the hotspot 1116 to the coolant. After the hotspot 1116 has cooled, the FDD 800 may deform from its configuration in FIG. 11D and return to the configuration of FIGS. 11A and 11C.

Figure 12A:
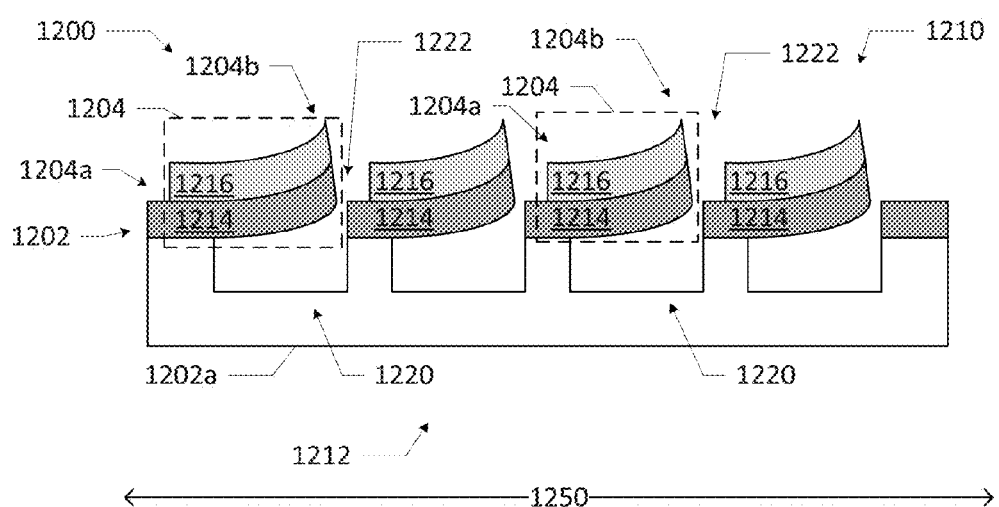
FIGS. 12A-12B are various views of a fifth FDD embodiment in a low temperature state.
Figure 12B:
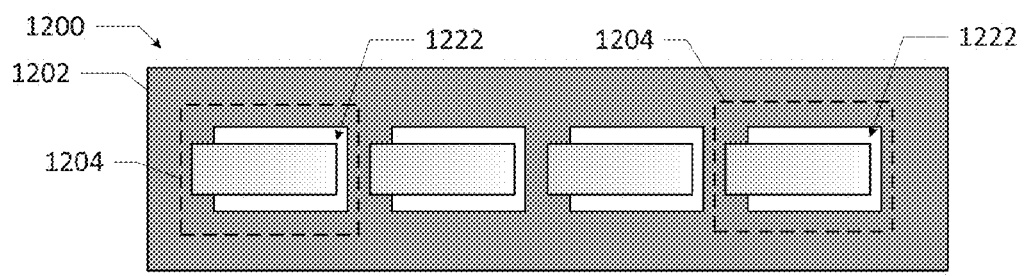

FIGS. 12A-12B are various views of an embodiment 1200 of an FDD. FIG. 12A is a side view of the FDD 1200 and FIG. 12B is a top view of the FDD 1200. The FDD 1200 may include a body 1202 (including a body material) and one or more thermally deformable fins 1204 arranged along the body 1202. Individual fins 1204 may include a first material 1214 and a second material 1216. The first material 1214 may have a different CTE than the second material 1216. In various embodiments, a fin 1204 may include three or more materials having same or different CTEs.

In some embodiments, the first material 1214 may be a same material as the body material. For example, as shown in FIG. 12A, the first material 1214 may be contiguous with the body 1202. In some such embodiments, the second material 1216 of a fin 1204 may extend from the body 1202, and may have a CTE that is higher than a CTE of the first material 1214. As shown in FIG. 12B, the body 1202 may include multiple apertures 1222, into which the fins 1204 may extend.

The FDD 1200 may have a first face 1210 and a second face 1212 opposite the first face 1210. One or more of the fins 1204 may extend from the first face 1210. In some embodiments, no fins 1204 may extend from the second face 1212. In other embodiments, one or more fins 1204 may extend from the second face 1212 (e.g., as discussed below with reference to FIGS. 15A-15C). Different ones of the fins 1204 of the FDD 1200 may be composed of the same materials, or different ones of the fins 1204 may be composed of different materials (e.g., different first materials 1214 and/or different second materials 1216). Each fin 1204 may include a first end 1204a and a second end 1204b. The first end 1204a may be secured to the body 1202, as shown. The body 1202 may include multiple apertures 1222, into which the fins 1204 may extend. The second end 1204b may not be secured to the body 1202, but may extend away from the body 1202. The FDD 1200 may have a longitudinal axis 1250.

In contrast with the FDD 800 discussed above, the fins 1204 of the FDD 1200 may have a curved shape when the FDD 1200 is in a low temperature state (e.g., not in the presence of any hotspots). This curved shape may be obtained by forming the initial attachment between the first material 1214 to the second material 1216 under elevated temperature conditions (e.g., 200-400 degrees Celsius, 300-400 degrees Celsius). Under such conditions, the second material 1216 (the "higher" CTE material) may expand to a greater degree than a corresponding amount of the first material 1214 (the lower CTE material), and the materials may be secured together while in this expanded state. Once the FDD 1200 is allowed to cool, the second material 1216 may contract to a greater degree than a corresponding amount of the first material 1214, causing the fins 1204 to have a shape that is curved around the second material 1216 in a low temperature state. When temperature conditions are elevated (e.g., in the presence of a hotspot), the fins 1204 may deform by changing their shape from the curved low temperature shape to a "flatter" shape (closer to the shape of the first material 1214 and the second material 1216 under the elevated temperature attachment conditions). This is illustrated and discussed below with reference to FIGS. 13A-13C and 14A-14B.

In some embodiments, the body 1202 may include an attachment portion 1202a, which may take the form of any of the attachment portions described herein (e.g., the attachment portion 802a of FIGS. 8A-8B). The attachment portion 1202a may be used to secure the FDD 1200 to a portion of an IC device, and may be, for example, a dielectric substrate having multiple cavities 1220. In some embodiments, the body 1202 may not include an attachment portion 1202a. Any other structure used to secure the FDD 1200 to a portion of an IC device may be used in various embodiments.

Multiple ones of the FDD 1200 may be arranged in an array, which may be included in an IC device. This may take the form of any of the embodiments described above with reference to the array 900 of FIGS. 9A-9B, for example. In particular, in some embodiments, the body 1202 may include one or more apertures (such as the apertures 922 of FIGS. 9A-9B) dimensioned and located so as to allow solder bumps or balls secured to a surface of an IC component to pass through the body 1202 without contacting the body 1202 and/or any of the fins 1204. In some embodiments, coolant may be provided to the cavities 1220 (which may be shared by two or more FDDs 1200, as discussed above with reference to the group 970 of FDDs 800 of FIG. 9A). When the fins 1204 are in the low temperature state, the coolant may not be substantially constrained to flow within the cavities 1220, but when the fins 1204 deform (as discussed below) the coolant flow may be more confined to the cavities 1220.

Figure 13A:
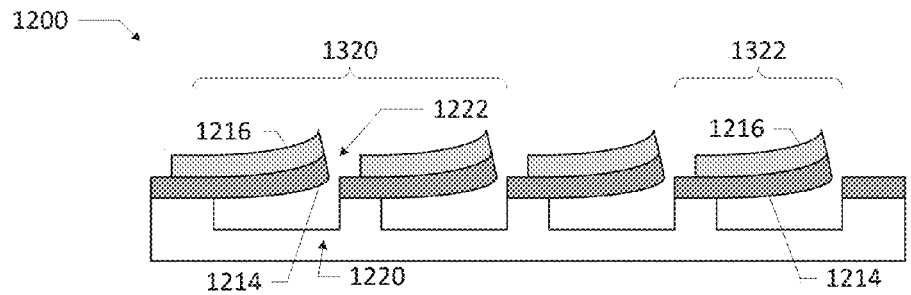
FIGS. 13A-13C illustrate the deformation of the fifth FDD embodiment (FIGS. 12A-12B) in response to various thermal conditions, in accordance with various embodiments.
Figure 13B:
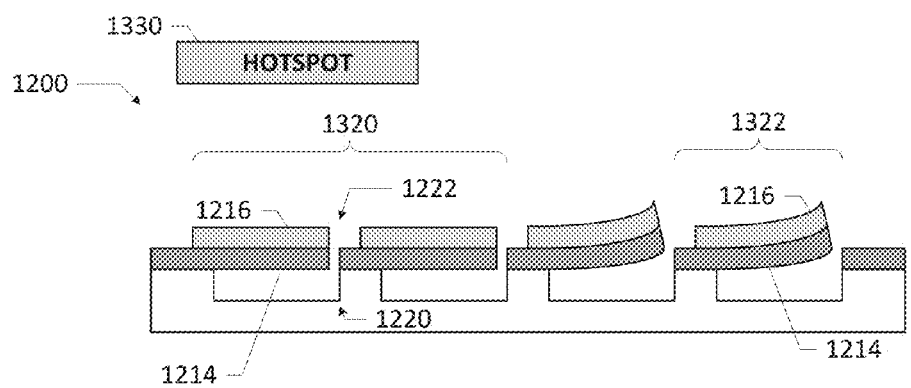
Figure 13C:
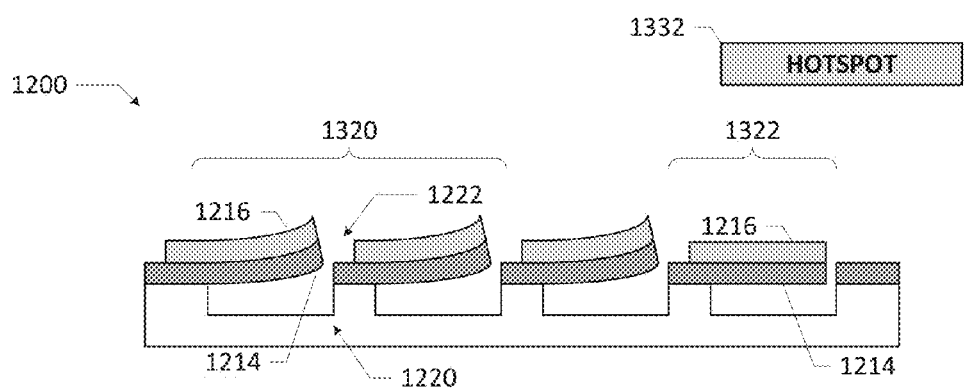

FIGS. 13A-13C illustrate the deformation of the FDD 1200 in response to various thermal conditions, in accordance with various embodiments. For the purposes of illustration, the embodiment of the FDD 1200 shown in FIGS. 13A-13C may include a second material 1216 of the fins 1204 that has a higher CTE than a CTE of the first material 1214. FIG. 13A depicts the FDD 1200 under thermal conditions in which no hotspots are proximate to the FDD 1200. Since thermal conditions are approximately uniform in the area around the FDD 1200, various collections of the fins 1204 (such as the collections 1320 and 1322) may exhibit approximately the same behavior; as shown in FIG. 13A, all of the fins 1204 may remain in their low temperature curved shape, without deformation.

FIG. 13B depicts the FDD 1200 under thermal conditions in which a hotspot 1330 is located closer to the collection 1320 than the collection 1322. Heat from the hotspot 1330 may cause the second material 1216 of the fins 1204 in the collection 1320 to expand. Heat from the hotspot 1330 may also cause the first material 1214 of the fins 1204 in the collection 1320 to expand; however, because the CTE of the second material 1216 is higher than the CTE of the first material 1214, the first material 1214 may not expand as much as a corresponding amount of the second material 1216. This may cause the fins 1204 of the collection 1320 to deform by curving around the lower CTE material (in this case, the first material 814) and thereby "flatten out" along the fins 1204 of the collection 1320. The fins 1204 of the collection 1322 may undergo some deformation due to the heat from the hotspot 1330, but because the collection 1322 is located farther from the hotspot 1330 than the collection 1320, the fins 1204 in the collection 1322 may deform (e.g., "flatten out") to a different (lesser) degree than the fins 1204 in the collection 1120.

FIG. 13C depicts the FDD 1200 under thermal conditions in which a hotspot 1332 is located closer to the collection 1322 than the collection 1320. Heat from the hotspot 1332 may cause the second material 1216 of the fins 1204 in the collection 1322 to expand. Heat from the hotspot 1332 may also cause the first material 1214 of the fins 1204 in the collection 1322 to expand; however, because the CTE of the second material 1216 is higher than a CTE of the first material 1214, the first material 1214 may not expand as much as a corresponding amount of the second material 1216, and the fins 1204 of the collection 1322 may deform by curving around the lower CTE material (the first material 1214), and thereby "flatten out" as discussed above with reference to FIG. 12B. The behavior of the fins 1204 in the collection 1322 under the thermal conditions of FIG. 13C may be analogous to those discussed above with reference to the behavior of the fins 1204 in the collection 1320 under the thermal conditions of FIG. 13B. In particular, the fins 1204 in the collection 1320 may undergo some deformation due to the heat from the hotspot 1332, but because the collection 1320 is located farther from the hotspot 1332 than the collection 1322, the fins 1204 in the collection 1320 may deform by curving (e.g., "flatten out") to a different (lesser) degree than the fins 1204 in the collection 1322.

If either of the hotspots 1330 or 1332 of FIGS. 13B and 13C, respectively, were to cool, the FDD 1200 may "relax" back to the configuration shown in FIG. 13A. In this manner, the FDD 1200 may deform in response to local hotspots, with fins proximate to the hotspots deforming to a greater degree than fins farther away from the hotspots, and this deformation may be dynamic as hotspots move (e.g., during operation of an IC device).

Figure 14A:
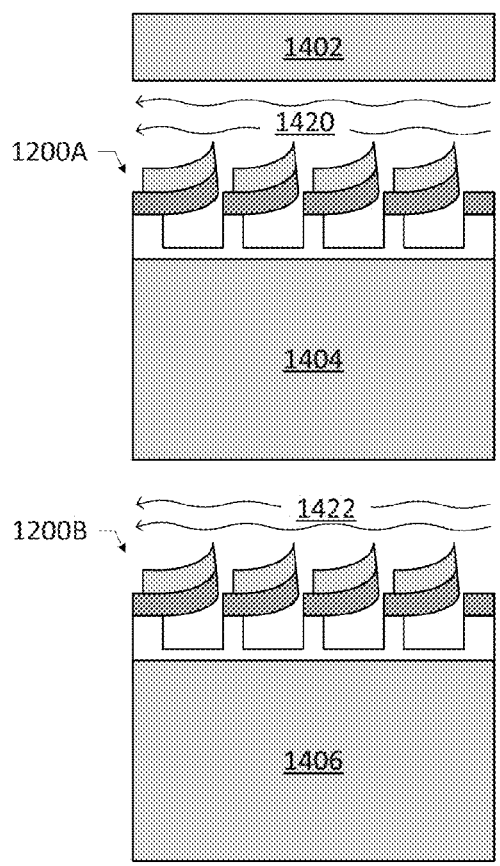
FIGS. 14A-14B illustrate the diversion of flowing coolant, in response to various thermal conditions, in an IC device that includes the fifth FDD embodiment (FIGS. 12A-12B), in accordance with various embodiments.
Figure 14B:
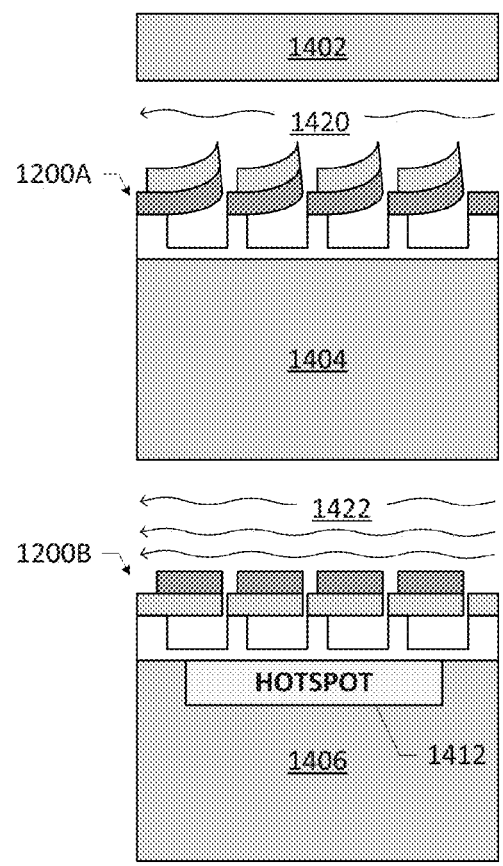

FIGS. 14A-14B illustrate the diversion of flowing coolant, in response to various thermal conditions, between three IC components 1402, 1404 and 1406 of an IC device that includes the FDD 1200, in accordance with various embodiments. In particular, an FDD 1200A may be disposed between the IC component 1402 and the IC component 1404, and an FDD 1200B may be disposed between the IC component 1404 and the IC component 1406. The IC components 1402, 1404 and 1406 may be dies or packages in a stack arrangement, for example.

As discussed above with reference to FIGS. 4A-4D, a coolant may be circulated through the area between the IC components 1402, 1404 and 1406 and around the FDDs 1200A and 1200B. In particular, in the arrangement of FIGS. 14A and 14B, coolant may be pumped from a coolant source toward the stack of IC components 1402, 1404 and 1406, and the flow may be split between the area 1420 separating the IC components 1402 and 1404, and the area 1422 separating the IC components 1404 and 1406. This splitting of flow may be a function of the geometry of the areas 1420 and 1422, among other things. For example, if the path through which coolant can flow between one pair of components has a smaller cross-sectional area (and/or that presents more obstructions) than a path through which coolant can flow between the other pair of components, the path with the smaller cross-sectional area (and/or presents more obstructions) may present more resistance to coolant flow and thus more coolant may flow through the path with the higher cross-sectional area (and/or fewer obstructions).

Although flow splitting is discussed below with reference to channels between two different pairs of IC components, flow splitting may occur between two different pathways between a single pair of IC components. For example, in embodiments in which multiple FDDs 1200 are arranged in an array having columns (e.g., the columns 902 and 904 of the array 900 of FIG. 9), flow splitting may occur between different columns, between different FDDs 1200 in a same column, or between different fins 1204 in a same FDD. Flow splitting may also occur between multiple IC components or FDDs arranged laterally (instead of stacked).

FIG. 14A depicts the flow of coolant around the FDDs 1200A and 1200B under thermal conditions in which no hotspots are proximate to either of the FDDs 1200A and 1200B. The configuration of the FDDs 1200A and 1200B under these thermal conditions may be substantially the same as discussed above with reference to FIG. 8A. In particular, the flow of coolant may be turbulent local to the fins 1204 of each of the FDDs 1200A and 1200B, but coolant may flow in a substantially similar manner across the FDDs 1200A and 1200B. In particular, a similar volume of coolant may flow across each of the FDDs 1200A and 1200B (assuming that the FDDs 1200A and 1200B have similar geometries, and the spacing between the IC components 1402 and 1404 is approximately the same as the spacing between the IC components 1404 and 1406).

FIG. 14B depicts the flow of coolant around the FDDs 1200A and 1200B under thermal conditions in which a hotspot 1412 is located closer to the FDD 1200B than the FDD 1200A. The configuration of the fins 1204 of the FDD 1200B under these thermal conditions may be substantially the same as discussed above with reference to the fins 1204 of the collection 1220 of FIG. 13B. In particular, the fins 1204 of the FDD 1200B may "flatten out" in response to the presence of the hotspot 1412. This changing configuration of the FDD 1200B may decrease the fluid resistance experienced by the coolant as it flows through the area 1422. The configuration of the fins 1204 of the FDD 1200A under the thermal conditions of FIG. 14B may be substantially the same as discussed above with reference to the fins 1204 of the collection 1222 of FIG. 13B. In particular, less heat from the hotspot 1412 may reach the FDD 1200A, and thus the fins 1204 of the FDD 1200A may not deform (e.g., "flatten out") to the same degree as the fins 1204 of the FDD 1200B.

Because the fluid resistance experienced by the coolant may decrease in the area 1422 relative to the fluid resistance in the area 1420, the volume of coolant flow through the area 1422 may increase relative to the volume of coolant flow through the area 1420. This increased coolant flow volume proximate to the hotspot 1412 may result in increased heat transfer from the hotspot 1412 to the coolant. After the hotspot 1412 has cooled, the FDD 1200B may deform from its configuration in FIG. 14B and return to the configuration of FIG. 14A.

Figure 15:
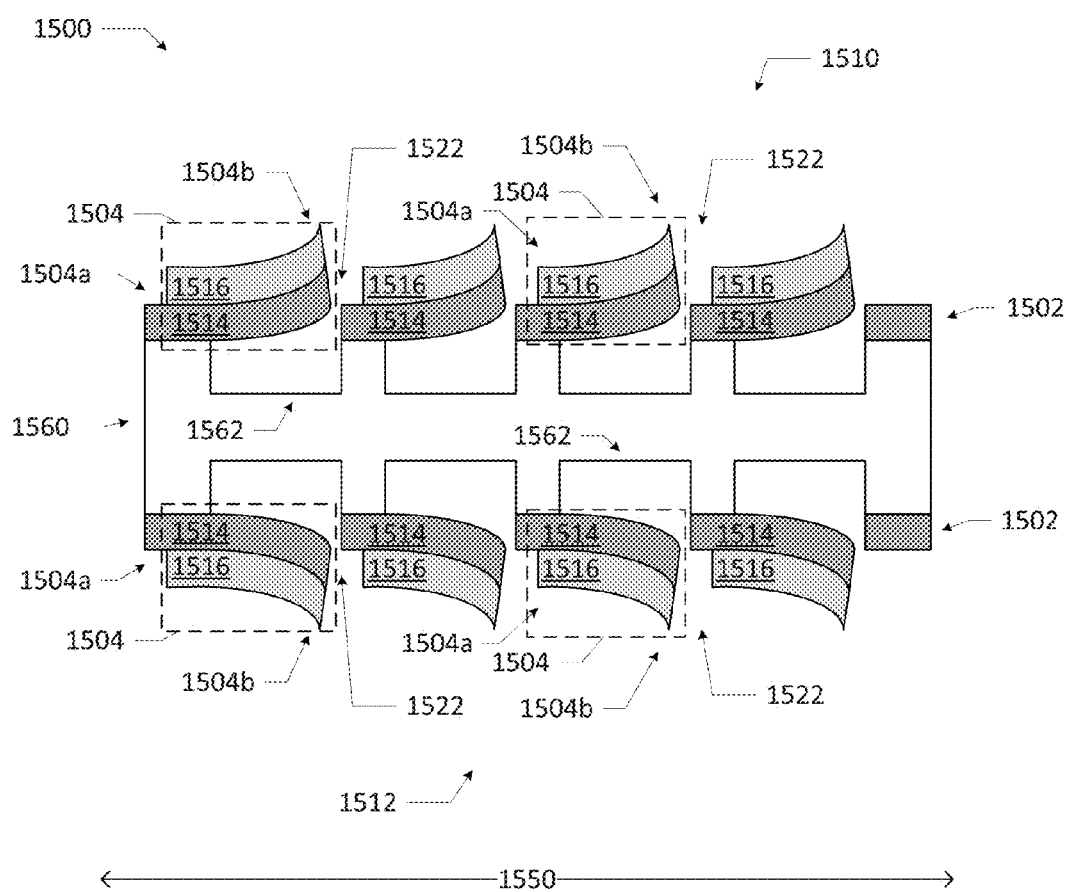
FIG. 15 is a side view of a sixth FDD embodiment in a low temperature state.

FIG. 15 is a side view of an embodiment 1500 of an FDD. As shown, the FDD 1500 may include a first face 1510 and a second face 1512, with each of the first face 1510 and the second face 1512 formed substantially as described above with reference to the FDD 1200. In particular, the FDD 1500 may include a body 1502 (including a body material) and one or more thermally deformable fins 1504 arranged along the body 1502. Individual fins 1504 may include a first material 1514 and a second material 1516. The first material 1514 may have a different CTE than the second material 1516. In various embodiments, a fin 1504 may include three or more materials having same or different CTEs.

In some embodiments, the first material 1514 may be a same material as the body material. For example, as shown in FIG. 15, the first material 1514 may be contiguous with the body 1502. In some such embodiments, the second material 1516 of a fin 1504 may extend from the body 1502, and may have a CTE that is higher than a CTE of the first material 1514. The body 1502 may include multiple apertures 1522, into which the fins 1504 may extend.

Different ones of the fins 1504 of the FDD 1200 may be composed of the same materials, or different ones of the fins 1504 may be composed of different materials (e.g., different first materials 1514 and/or different second materials 1516). Each fin 1504 may include a first end 1504a and a second end 1504b. The first end 1504a may be secured to the body 1502, as shown. The second end 1504b may not be secured to the body 1502, but may extend away from the body 1502. The FDD 1500 may have a longitudinal axis 1550.

As discussed above with reference to the FDD 1200, the fins 1504 of the FDD 1500 may have a curved shape when the FDD 1500 is in a low temperature state (e.g., not in the presence of any hotspots), and may be formed in accordance with any of the techniques discussed above with reference to the FDD 1200. When temperature conditions are elevated (e.g., in the presence of a hotspot), the fins 1504 may deform by changing their shape from the low temperature curved shape to a "flatter" shape (as illustrated and discussed above with reference to FIGS. 13A-13C and 14A-14B).

In some embodiments, the FDD 1500 may include a separator 1560, which may take the form of two attachment portions 802a (FIG. 8A) secured "back to back." The separator 1560 may include one or more cavities 1562 proximate to the first face 1510, and/or one or more cavities 1562 proximate to the second face 1512. In some embodiments, the separator 1560 may not include any cavities 1562. In some embodiments, the separator 1560 may be formed from a dielectric or insulating material. In some embodiments, the separator 1560 may not be included in the FDD 1500.

In some embodiments, the body 1502 may include an attachment portion (not shown), which may take the form of any of the attachment portions described herein, and may be used to secure the FDD 1500 to a portion of an IC device. In some embodiments, the FDD 1500 may be included in an array (such as the array 900 of FIGS. 9A-9B), and the fins 1504 of the FDD 1500 may be spaced away from an IC component (e.g., the IC component 210 of FIG. 9B) by spacers (e.g., formed of dielectric material) disposed between the body 1502 and the IC component. For example, annular spacers may be positioned between the array 900 and the IC component 210, and may be centered on the apertures 922 so as to allow the solder bumps or balls 208 to extend through the annular spacer and the aperture 922 while spacing the body 1502 away from the surface to 222 of the IC component 210. Such spacers (annular or solid) may be used as an attachment portion for any of the embodiments disclosed herein.

FIGS. 16A-16D illustrate the diversion of flowing coolant, in response to various thermal conditions, between IC components 402 and 404 of an IC device that includes the FDD 1500, in accordance with various embodiments. In particular, the FDD 1500 may be disposed between the IC component 402 and the IC component 404. As discussed above with reference to FIGS. 4A-4D, a coolant may be circulated through the area between the IC components 402 and 404 around the FDD 1500. In particular, the flow of coolant may be split between the area 1660 between the first face 1510 and the IC component 402 and the area 1662 between the second face 1512 and the IC component 404. As discussed above with reference to FIGS. 14A and 14B, this splitting of flow may be a function of the geometry of the areas 1660 and 1662, among other things. For example, if the path through which coolant can flow between the FDD 1500 and one of the IC components has a smaller cross-sectional area (and/or presents more obstructions) than a path through which coolant can flow between the FDD 1500 and the other of the IC components, the path with the smaller cross-sectional area (and/or that presents more obstructions) may present more resistance to coolant flow and thus more coolant may flow through the path with the higher cross-sectional area (and/or fewer obstructions).

Figures 16A, 16B, 16C, 16D:
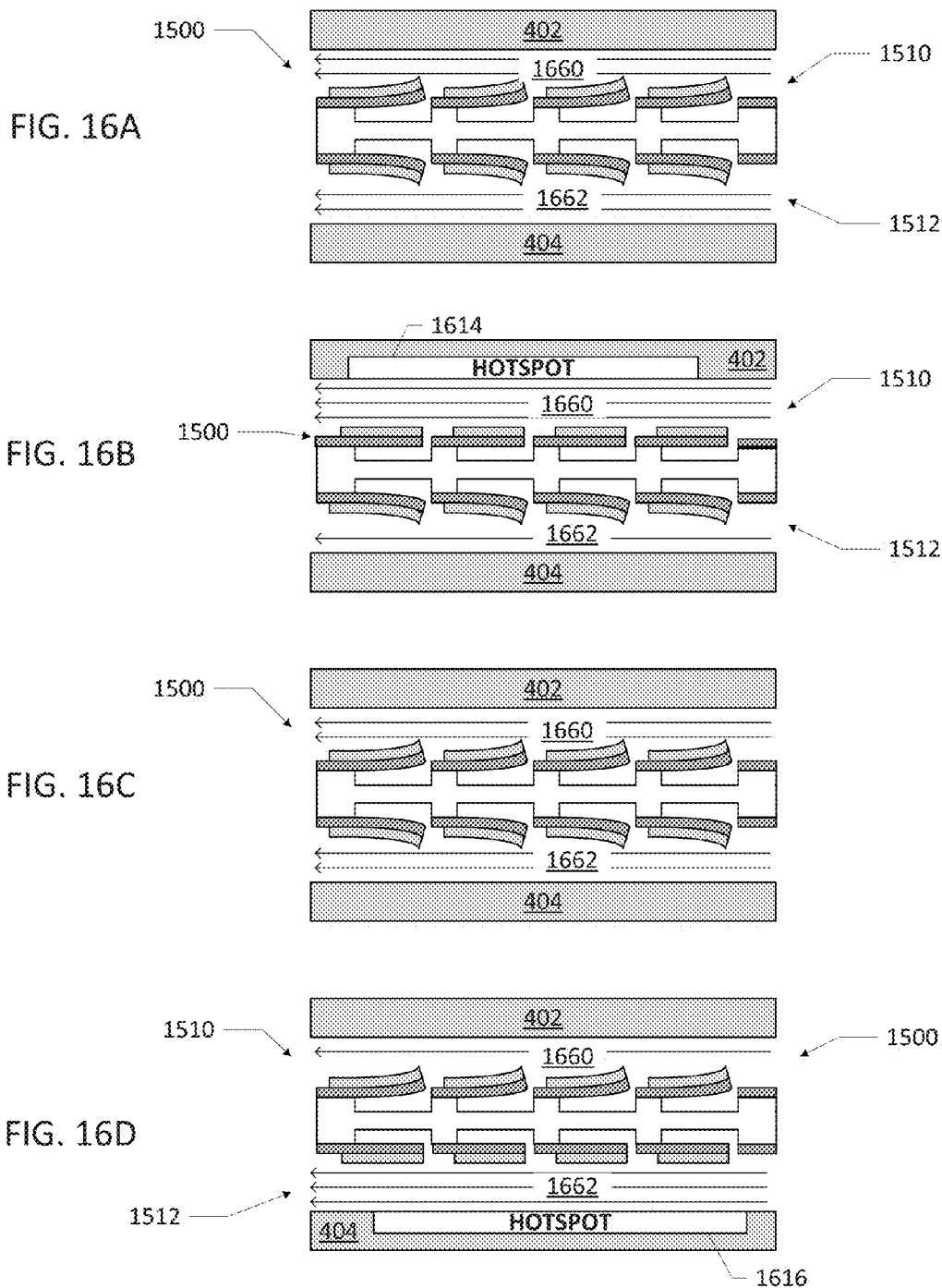
FIGS. 16A-16D illustrate the diversion of flowing coolant, in response to various thermal conditions, in an IC device that includes the sixth FDD embodiment (FIG. 15), in accordance with various embodiments.

FIG. 16A depicts the flow of coolant around the FDD 1500 under thermal conditions in which no hotspots are proximate to the FDD 1500. The configuration of the FDD 1500 under these thermal conditions may be substantially the same as discussed above with reference to FIG. 15. In particular, the flow of coolant may be turbulent local to the fins 1504 of the FDD 1500, but coolant may flow in a substantially similar manner in the area 1660 and in the area 1662. In particular, a similar volume of coolant may flow in the area 1660 and the area 1662 (assuming that the fins 1504 on the first face 1510 and the second face 1512 of the IC component 1500 have similar geometries, and that the FDD 1500 is spaced approximately halfway between the IC component 402 and the IC component 404).

FIG. 16B depicts the flow of coolant around the FDD 1500 under thermal conditions in which a hotspot 1614 is located closer to the first face 1510 of the FDD 1500 than the second face 1512. The configuration of the fins 1504 of the first face 1510 of the FDD 1500 under these thermal conditions may be substantially the same as discussed above with reference to the fins 1204 of the FDD 1200B of FIG. 14B. In particular, the fins 1504 of the first face 1510 of the FDD 1500 may "flatten out" in response to the presence of the hotspot 1614. This changing configuration of the FDD 1500 may decrease the fluid resistance experienced by the coolant as it flows through the area 1660. The configuration of the fins 1504 of the second face 1512 of the FDD 1500 under the thermal conditions of FIG. 16B may be substantially the same as discussed above with reference to the fins 1204 of the FDD 1200A of FIG. 14B. In particular, less heat from the hotspot 1614 may reach the second face 1512 of the FDD 1500, and thus the fins 1504 of the second face 1512 of the FDD 1500 may not deform (e.g., "flatten out") to the same degree as the fins 1504 of the first face 1510 of the FDD 1500. Because the fluid resistance experienced by the coolant may decrease in the area 1660 relative to the fluid resistance in the area 1662, the volume of coolant flow through the area 1660 may increase relative to the volume of coolant flow through the area 1662. This increased coolant flow volume proximate to the hotspot 1614 may result in increased heat transfer from the hotspot 1614 to the coolant.

FIG. 16C depicts the flow of coolant around the FDD 1500 under thermal conditions after the hotspot 1614 has cooled. In response to the cooling of the hotspot 1614, the FDD 1500 may deform from its configuration in FIG. 16B and return to the configuration of FIG. 16A.

FIG. 16D depicts the flow of coolant around the FDD 1500 under thermal conditions in which a hotspot 1616 is located closer to the second face 1512 of the FDD 1500 than the first face 1510. The configuration of the fins 1504 of the second face 1512 of the FDD 1500 under these thermal conditions may be substantially the same as discussed above with reference to the fins 1204 of the FDD 1200B of FIG. 14B. In particular, the fins 1504 of the second face 1512 of the FDD 1500 may "flatten out" in response to the presence of the hotspot 1616. This changing configuration of the FDD 1500 may decrease the fluid resistance experienced by the coolant as it flows through the area 1662. The configuration of the fins 1504 of the first face 1510 of the FDD 1500 under the thermal conditions of FIG. 16D may be substantially the same as discussed above with reference to the fins 1204 of the FDD 1200A of FIG. 14B. In particular, less heat from the hotspot 1616 may reach the first face 1510 of the FDD 1500, and thus the fins 1504 of the first face 1510 of the FDD 1500 may not deform (e.g., "flatten out") to the same degree as the fins 1504 of the second face 1512 of the FDD 1500. Because the fluid resistance experienced by the coolant may decrease in the area 1662 relative to the fluid resistance in the area 1660, the volume of coolant flow through the area 1662 may increase relative to the volume of coolant flow through the area 1660. This increased coolant flow volume proximate to the hotspot 1616 may result in increased heat transfer from the hotspot 1616 to the coolant. After the hotspot 1616 has cooled, the FDD 1500 may deform from its configuration in FIG. 16D and return to the configuration of FIGS. 16A and 16C.

As noted above, the FDD 1500 may include a first face 1510 and a second face 1512, with each of the first face 1510 and the second face 1512 formed as described above with reference to the FDD 1200. In various embodiments, the FDD 1500 may include a first face 1510 and a second face 1512, with each of the first face 1510 in the second face 1512 formed as described above with reference to the FDD 800. In such an embodiment, the fins may be substantially "flat" in a low temperature state, and may deform to curve away from the body in response to heat.

As noted above, in some embodiments, coolant may be directed into cavities under fins of an FDD (such as the cavities 820, 1220 and 1562 of the FDDs 800, 1200 and 1500, respectively). In such embodiments, the deformation of the fins may act as "gates" to adjust the flow of coolant between the cavities and the regions outside the cavities. In some embodiments, the deformation may "trap" coolant in the cavities when hotspots are proximate to the cavities to improve heat transfer between the hotspots and the coolant in the cavities. In some embodiments, the deformation may "release" coolant into the regions outside the cavities when hotspots are outside the cavities to improve heat transfer between the hotspots and the coolant. In some embodiments, FDDs similar to the FDDs 800 and 120 may be implemented without the attachment portions 802a and 1202a, respectively, and may be positioned at boundaries between two or more areas in an IC device to act as "gates" that open and close as the fins deform to regulate the flow of coolant between the first faces 810 or 1210 and the second faces 812 or 1212, respectively.

The FDDs disclosed herein may be fabricated using any suitable process. FIGS. 17A-17G illustrate cross-sectional views of various stages in an example process for manufacturing the FDD 800 (FIGS. 8A-8B), in accordance with various embodiments. The techniques discussed below with reference to FIGS. 17A-17G may be modified (e.g., by changing the order of various operations and/or substituting new or alternative materials) to fabricate other suitable embodiments of FDDs.

Figure 17A:
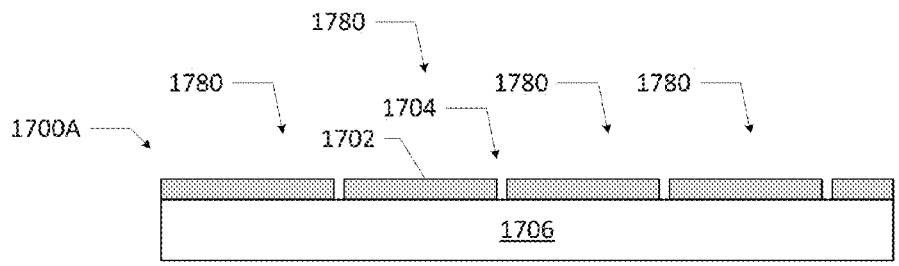

FIG. 17A illustrates an assembly 1700A that includes a body material 1702 disposed on a dielectric substrate 1706. The body material 1702 may include one or more apertures 1704 proximate to fin areas 1780. In some embodiments, the apertures 1704 may be formed by laser cutting or stamping into a solid sheet of body material. The apertures 1704 may take any desired form, such as any of the forms shown in the top views of the inset 1720. In some embodiments, the body material 1702 may include copper, aluminum, or another material having a similar CTE. In some embodiments, the dielectric substrate 1706 may include silicon dioxide, an organic laminate material, or any other suitable material.

Figure 17B:
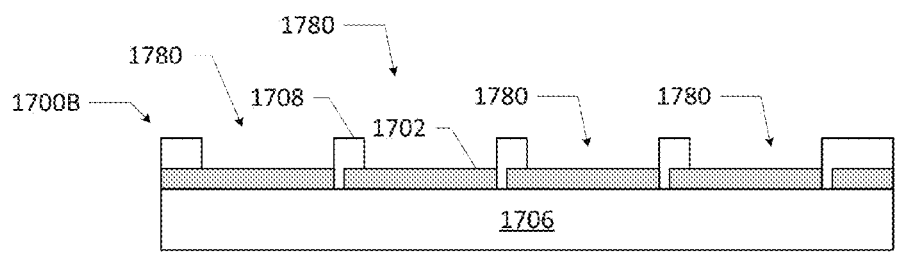

FIG. 17B illustrates an assembly 1700B subsequent to deposition of a photoresist 1708 on the assembly 1700A. The photoresist 1708 may be deposited by lithography or another suitable technique. The photoresist 1708 may be patterned so as to leave portions of the body material 1702 in the fin areas 1780 exposed.

Figure 17C:
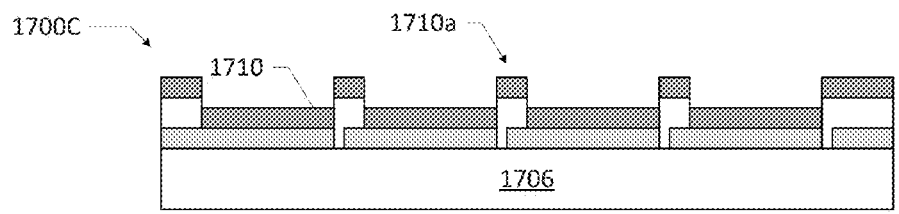

FIG. 17C illustrates an assembly 1700C subsequent to deposition of a second material 1710 on the assembly 1700B. The second material 1710 may have a lower CTE than the body material 1702 (as discussed above with reference to FIGS. 8A-8B). In some embodiments, the second material 1710 may include nickel, titanium, titanium nitride, tungsten, molybdenum, or chromium, for example. The second material 1710 may be deposited using any suitable technique. In some embodiments, the second material 1710 (e.g., titanium, titanium nitride, molybdenum or chromium) may be deposited using a physical vapor deposition (PVD) technique. For example, in some embodiments, the second material 1710 (e.g., nickel) may be selectively patterned onto the assembly 1700B via electroplating. When the second material 1710 is selectively patterned, deposition of the second material 1710 on the photoresist 1708 may be selectively avoided (and thus the portions 1710a of the second material 1710 may not be present). The second material 1710 may be deposited on the assembly 1700B under low temperature conditions (e.g., 30 degrees Celsius or less).

FIG. 17D illustrates an assembly 1700D subsequent to removal of the photoresist 1708 from the assembly 1700C. The second material 1710 may remain in the fin areas 1780, as dictated by the patterning of the photoresist 1708. In some embodiments, removing the photoresist 1708 may include using a resist strip. In some embodiments, removing the photoresist 1708 may include using a resist strip and lifting off any sputtered material on the photoresist 1708. Top views of example embodiments of the assembly 1700D are depicted in the inset 1722. In some embodiments, the assembly 1700D may be used as an FDD, having fins 1704 with the body material 1702 serving as the first material of a fin and the second material 1710 serving as the second material of the fin. Thus, in some embodiments, the operations illustrated in FIGS. 17E-17G may not be performed. In some embodiments, the dielectric substrate 1706 may be removed from the assembly 1700D, and the resulting assembly may be used as an FDD, as discussed above. Any suitable technique may be used to remove the dielectric substrate 1706 while preserving the body material 1702 and the second material 1710. For example, if the dielectric substrate 1706 is formed from silicon dioxide, the assembly 1700D may be inserted into a hydrofluoric wet etch chemistry to remove the dielectric substrate 1706 from the body material 1702 and the second material 1710.

FIG. 17E illustrates an assembly 1700E subsequent to deposition of a photoresist 1712 on the assembly 1700D. The photoresist 1712 may be deposited by lithography or another suitable technique, and may be patterned so as to enable the etch of cavities under the fin areas 1780. A top view of an embodiment of the assembly 1700E is shown in the inset 1726. The embodiment in the inset 1726 includes two columns 1740 and 1742 of fin areas 1780, with the fin areas 1780 in the column 1740 spaced closer together than the fin areas 1780 in the column 1742. The photoresist 1712 may be deposited so as to cover the ends of the fin areas 1780 (e.g., corresponding to the first end 804a and the second end 804b of the fins 804 of FIG. 8A), but to leave exposed the substrate 1706 on the sides of the fin areas 1780, as shown. As noted above, in embodiments in which no dielectric substrate 1706 is to be included in the FDD, no photoresist 1712 need be applied; instead, the dielectric substrate 1706 may be removed (e.g., in accordance with the techniques discussed above with reference to FIG. 17D or below with reference to FIG. 17F).

Figure 17F:
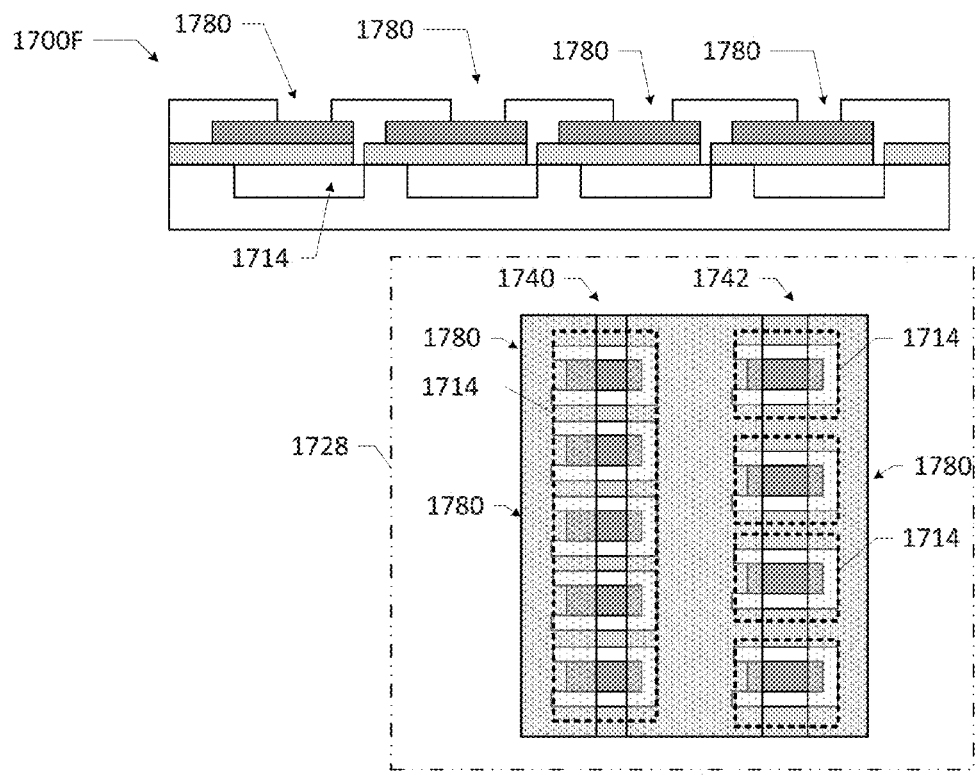

FIG. 17F illustrates an assembly 1700F subsequent to under-etching of the body material 1702 to form one or more cavities 1714. In some embodiments, this under-etching may be performed by a selective isotropic etch. For example, if the dielectric substrate 1706 is silicon dioxide, a wet hydrofluoric acid etch chemistry may be suitable. An isotropic etch may progress with approximately the same rate in all etch directions starting from the exposed areas (e.g., areas not covered by the photoresist 1712 or the body material 1702). A top view of an embodiment of the assembly 1700F is shown in the inset 1728. The embodiment of the inset 1728 may be formed by isotropic etch of the embodiment of the inset 1728 for a certain period of time. In particular, the embodiment of the inset 1728 may include cavities 1714 (indicated by dotted lines) formed under the fin areas 1780. In the column 1740, the cavity 1714 may span multiple fin areas 1780 (e.g., because the isotropic etch was allowed to continue until cavities under adjacent fin areas 1780 merged). In the column 1742, the cavities 1714 may be separate between fin areas 1780 (e.g., because the isotropic etch was stopped before cavities under adjacent fin areas 1780 merged). The use of fin areas 1780 with different spacings is simply illustrative, and FDDs may include any desired arrangement of fins and cavities. Additionally, as noted above, some embodiments of the FDDs disclosed herein may not include cavities.

Figure 17G:
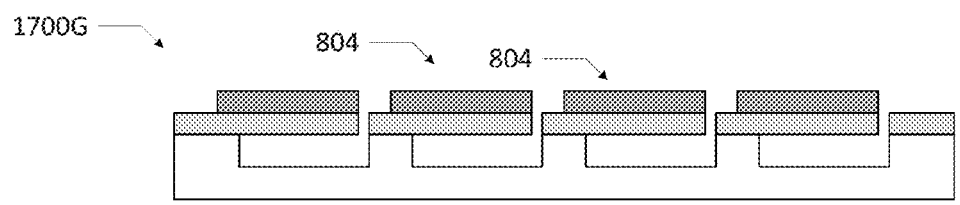

FIG. 17G illustrates an assembly 1700G subsequent to removal of the photoresist 1712 from the assembly 1700F. The assembly 1700G may have the form of the FDD 800 (FIGS. 8A-8C), including one or more fins 804 and other features discussed above.

As noted above, analogous operations to the fabrication operations illustrated in FIGS. 17A-17G may be used to form any of a number of the embodiments of FDDs disclosed herein. For example, the FDD 1200 (FIGS. 12A-12B) may be fabricated by using a body material 1702 having a lower CTE than the second material 1710, and depositing the second material 1710 on the body material 1702 at a high temperature (e.g., 200-400 degrees Celsius), so that the second material 1710 is in an expanded state during deposition, and will then cool to form the curved fins 1204 of the FDD 1200. In such embodiments, a photoresist material suitable for use at higher temperatures may be used as the photoresist 1708, such as a photosensitive polyimide. In some embodiments, the FDD 1500 (FIG. 15) may be formed by recurring two FDDs 1200 "back to back." An FDD may be formed by securing two FDDs 800 "back to back."

As illustrated above with reference to FIGS. 17A-17G, various semiconductor manufacturing operations may be used to fabricate the FDDs disclosed herein. In some embodiments, one or more deposition and patterning operations may be used to deposit and pattern the first and second materials of the FDDs. Different materials may be more appropriately deposited using some techniques than others. For example, in some embodiments, PVD may be used to deposit aluminum, copper, nickel, titanium, titanium nitride, molybdenum and/or chromium, as desired. In some embodiments, chemical vapor deposition (CVD) may be used to deposit tungsten. Other deposition and fabrication techniques may be employed to form the FDDs disclosed herein. For example, microelectromechanical systems (MEMS) fabrication operations may be used to form suitable ones of the FDDs disclosed herein.

In some embodiments, some or all of an FDD (such as any of the FDDs disclosed herein) may have an electrically insulating layer disposed on an outer surface. For example, a thin layer of a polymer material may coat some or all of the FDD (e.g., the fins of the FDD). This polymer material may be a polyimide or a photosensitive polyimide material, for example, and may be deposited by a spin-on process. In some embodiments, a channel between IC components may be coated in an electrically insulating layer, and an FDD disposed in the channel may or may not have an electrically insulating coating. A layer of insulation on one or both of the FDD and the channel may reduce the likelihood of a short circuit or other problematic contact.

Figure 18:
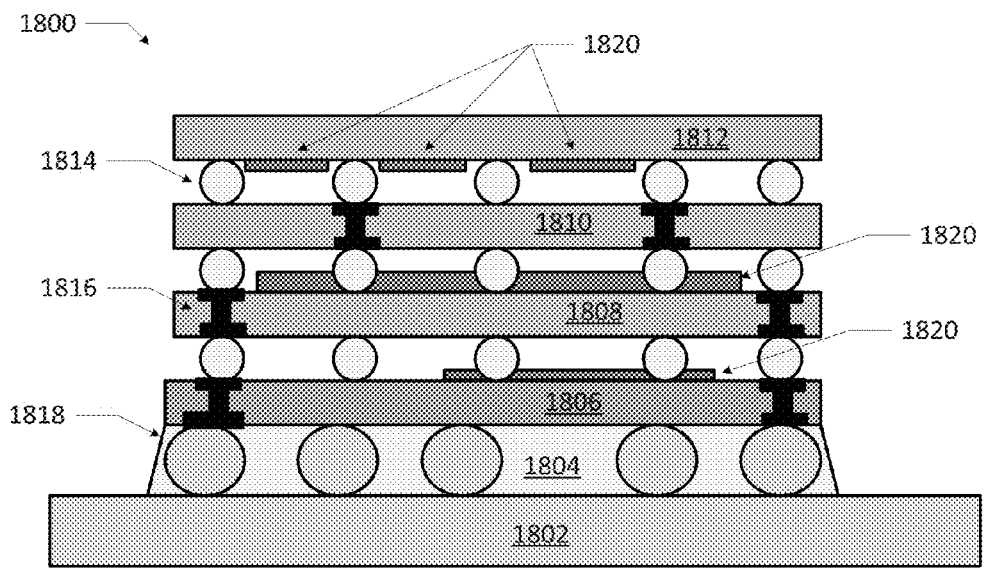
FIGS. 18 and 19 illustrate IC devices including FDDs, in accordance with various embodiments.
Figure 19:
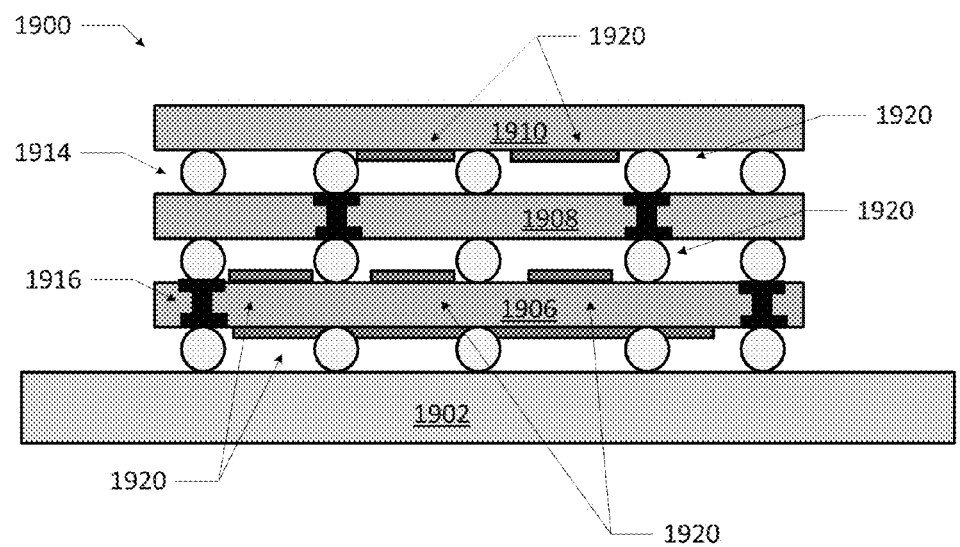

FIGS. 18 and 19 illustrate IC devices including FDDs, in accordance with various embodiments. FIG. 18 illustrates an embodiment in which one or more FDDs 1820 are included in an IC device 1800 having a stack arrangement of three die 1808, 1810 and 1812. Each of the dies 1808, 1810 and 1812 may include, for example, an active chip having active devices in a semiconductor substrate, a layer of on-chip interconnects, and a passivation layer. Solder bumps 1814 may be disposed between the dies 1808, 1810 and 1812, and through silicon vias (TSVs) 1816 (or other front-to-back connections) may electrically couple various ones of the solder bumps 1814. The die 1808 may be disposed on a substrate 1806, and may be coupled with the substrate 1806 via one or more solder bumps 1814. The substrate 1806 may be a laminate, a passive silicon interposer, or any other suitable substrate. The substrate 1806 may be disposed on a printed circuit board 1802, and may be coupled with the printed circuit board 1802 via one or more solder balls 1818. The substrate 1806 may also include one or more TSVs 1816 to provide electrical pathways. The area between the substrate 1806 and the printed circuit board 1802 may be substantially filled with an underfill material 1804.

FIG. 19 illustrates an embodiment in which one or more FDDs 1920 are included in an IC device 1900 having a package-on-package stack. In FIG. 19, three packages 1906, 1908 and 1910 are arranged in a stack. Each of the packages 1906, 1908 and 1910 may include, for example, one or more active chips. Examples of packages may include embedded wafer-level ball grid array (eWLB) packages and/or flip chip (FC) packages. Solder balls 1914 may be disposed between the packages 1906, 1908 and 1910, and TSVs 1916 (or other front-to-back connections) may electrically couple various ones of the solder balls 1914. The package 1906 may be disposed on a printed circuit board 1902, and may be coupled with the printed circuit board 1902 via one or more solder balls 1914.

A number of FDDs 1820 and 1920 are depicted as disposed in various locations in the IC devices 1800 and 1900. These locations are simply illustrative, and one or more FDDS may be disposed in any desired location. For example, in some embodiments, one or more FDDs may be disposed on an outer surface of a die stack or package stack (e.g., in a location to which a heatsink may conventionally be attached. The FDDs 1820 and 1920 may include any one or more of the embodiments of FDDs disclosed herein (e.g., the FDDs 100, 500, 600, 800, 1200 or 1500) or arrays of FDDs. The choice of which types of FDDs to include in the IC device 1800 and/or 1900 may depend on which components in the IC devices 1800 and 1900 are expected to generate heat, the amount of heat expected to be generated, the frequency of heat generation, the pattern of coolant flow proximate to the various IC components, and the space available in which to position FDDs, among others. Multiple hotspots may occur in different regions of the IC devices 1800 and 1900 at the same time (e.g., in multiple packages and/or dies, and/or in multiple regions in a single package and/or die), and in various embodiments, multiple FDDs may deform in response to these hotspots in parallel to adjust coolant flow to improve the transfer of heat away from these hotspots.

Figure 20:
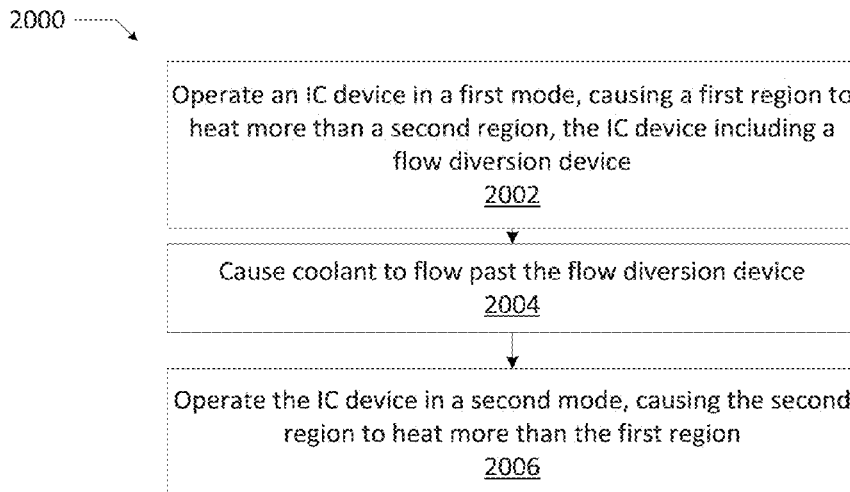
FIG. 20 is a flow diagram of an illustrative process for directing coolant in an IC device having an FDD, in accordance with various embodiments.

FIG. 20 is a flow diagram of an illustrative process 2000 for directing coolant in an IC device that includes an FDD, in accordance with various embodiments. Any one or more of the FDD embodiments disclosed herein may be used to perform the process 2000.

At the operation 2002, the IC device may be operated in a first mode. As used herein, a "mode" of operation may be referred to any particular usage of various hardware resources in an IC device. The IC device may transition between different modes during operation. For example, an IC device acting as a server may operate in a first mode while transmitting data and in a second mode while receiving data. An IC device may operate in multiple modes serially, in parallel, or in any combination.

Operation of the IC device in the first mode may cause a first region of the IC device to generate more heat than a second region of the IC device. For example, as illustrated in FIGS. 4A-4D, operation of an IC device (having IC components 402 and 404) in a first mode may result in the hotspot 414 (because the IC device may generate more heat in the region proximate to the hotspot 414 than in other regions). The FDD included in the IC device may include a first collection of individual fins that are closer to the first region of the IC device than the second region of the IC device, and a second collection of individual fins that are closer to the second region of the IC device than the first region of the IC device. For example, as illustrated in FIGS. 4A-4D, the collection 120 of fins 104 may be closer to the hotspot 414 than the collection 122 of fins 104. In response to the first region generating more heat than the second region, individual fins of the first collection may deform to a greater degree than individual fins of the second collection. For example, as illustrated in FIGS. 4A-4D, the collection 120 of fins 104 may deform to a greater degree in response to the hotspot 414 than the fins 104 of the collection 122.

In some embodiments, deforming to a greater degree may include increasing curvature of a fin (e.g., as discussed above with reference to the FDD 100). Greater curvature of a fin away from the body may cause the coolant to undergo more turbulence proximate to the hotspot. In some embodiments, deforming to a greater degree may include decreasing curvature of a fin (e.g., as discussed above with reference to the FDD 1200). Lesser curvature of a fin may cause a greater volume of coolant to flow proximate to the hotspot.

At the operation 2004, coolant may be caused to flow past the FDD included in the IC device. The IC device may include any of a number of coolant flow devices that may control the flow of coolant in the IC device, such as a pump 2110, a coolant reservoir 2112, and a coolant distribution network 2114, (discussed below with reference to FIG. 21). In some embodiments, the coolant may flow in a direction parallel to a longitudinal axis of the FDD. In some embodiments, the coolant may flow in a direction perpendicular to a longitudinal axis of the FDD. In some embodiments, coolant may flow in any desired direction relative to the FDD.

At the operation 2006, the IC device may be operated in a second mode. Operation of the IC device in the second mode may cause the second region of the IC device to generate more heat than the first region of the IC device. For example, as illustrated in FIGS. 4A-4D, operation of an IC device (having IC components 402 and 404) in a second mode may result in the hotspot 416 (because the IC device may generate more heat in the region proximate to the hotspot 416 than in other regions). In response to the second region generating more heat than the first region, individual fins of the second collection may deform to a greater degree than individual fins of the first collection. For example, as illustrated in FIGS. 4A-4D, the collection 122 of fins 104 may deform to a greater degree in response to the hotspot 416 than the fins 104 of the collection 120.

The process 2000 may continue as various regions of the IC device heat and cool. In response, various collections of fins of the FDD may deform. This deformation may cause the coolant to pull more heat from the heat-generating region (e.g., by increased local turbulence, increased volume of coolant flow, a combination of such mechanisms, or any other mechanism).

Figure 21:
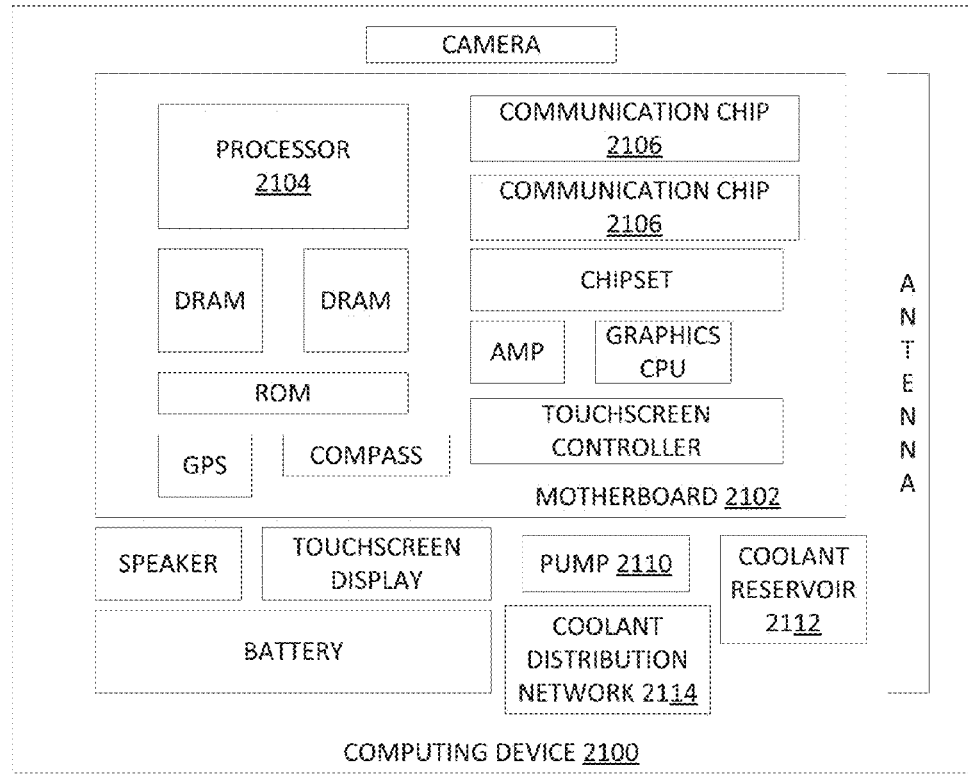
FIG. 21 is a block diagram of an example computing device that may include one or more of any of the FDDs disclosed herein.

Embodiments of the present disclosure may be implemented into a system using any suitable hardware that may benefit from the coolant flow diversion techniques disclosed herein. FIG. 21 schematically illustrates a computing device 2100, in accordance with some implementations, which may include one or more FDDs. The computing device 2100 may be, for example, a mobile communication device or a desktop or rack-based computing device. The computing device 2100 may house a board such as motherboard 2102. The motherboard 2102 may include a number of components, including (but not limited to) a processor 2104 and at least one communication chip 2106. Any of the components discussed herein with reference to the computing device 2100 may be arranged in a stack (such as the stack arrangements illustrated in FIGS. 18 and 19), and FDDs may be included in channels between stacked components and/or between laterally adjacent components and/or on any desired surface of such components, for example. The processor 2104 may be physically and electrically coupled to the motherboard 2102. In some implementations, the at least one communication chip 2106 may also be physically and electrically coupled to the motherboard 2102. In further implementations, the communication chip 2106 may be part of the processor 2104.

Depending on its applications, the computing device 2100 may include other components that may or may not be physically and electrically coupled to the motherboard 2102. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disc (CD), digital versatile disc (DVD), and so forth). In various embodiments, FDDs may be disposed between, on, or around any of these components.

The communication chip 2106 and the antenna may enable wireless communications for the transfer of data to and from the computing device 2100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2106 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 2106 may operate in accordance with a GSM, General Packet Radio Service (GPRS), Universal Mobile Telecommunications System (UMTS), High Speed Packet Access (HSPA), Evolved HSPA (E-HSPA), or LTE network. The communication chip 606 may operate in accordance with Enhanced Data for GSM Evolution (EDGE), GSM EDGE Radio Access Network (GERAN), UTRAN, or Evolved UTRAN (E-UTRAN). The communication chip 2106 may operate in accordance with CDMA, Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 2106 may operate in accordance with other wireless protocols in other embodiments.

The computing device 2100 may include a plurality of communication chips 2106. For instance, a first communication chip 2106 may be dedicated to shorter range wireless communications such as Wi-Fi and Bluetooth and a second communication chip 2106 may be dedicated to longer range wireless communications such as GPS, EDGE, GPRS, CDMA, WiMAX, LTE, Ev-DO, and others. In some embodiments, the communication chip 2106 may support wired communications. For example, the computing device 2100 may include one or more wired servers.

The processor 2104 and/or the communication chip 2106 of the computing device 2100 may include one or more dies or other components in an IC package. The term "processor" may refer to any device or portion of a device that processes electronic data from registers and/or memory to transform that electronic data into other electronic data that may be stored in registers and/or memory. As discussed above, these components may be stacked and/or laterally arranged in any desired configuration, and FDDs may be disposed on or around any such component.

The computing device 2100 may include one or more devices for managing coolant flow, such as a pump 2110, a coolant reservoir 2112, and a coolant distribution network 2114. The pump 2110 may use any desired displacement technique to pump coolant past the FDDs included in the computing device 2100, such as positive displacement, impulse, velocity, or gravity, for example. The pump 2110 may include an electronic controller configured to selectively operate the pump 2110 to move coolant in any desired manner. The coolant reservoir 2112 may be a tank or other device that contains coolant (e.g., a gas or liquid coolant) that may be distributed around the FDDs via pressure from the pump 2110. The coolant reservoir 2112 may be coupled with the coolant distribution network 2114, which may include one or more pipes, channels or other pathways through the computing device 2100 that may route coolant to various regions of the computing device 2100 (e.g., around one or more FDDs included in the computing device 2100).

In various implementations, the computing device 2100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 2100 may be any other electronic device that processes data. In some embodiments, the FDDs may be implemented in a high-performance computing device.

The following paragraphs provide a number of examples of embodiments of the present disclosure.

Example 1 is a FDD, including: a body comprising a body material; and a plurality of thermally deformable fins arranged along the body, wherein individual fins of the plurality of fins comprise a first material and second material, the first material having a different CTE than a CTE of the second material.

Example 2 may include the subject matter of Example 1, and further specifies that: the plurality of fins comprise a first fin; the first material of the first fin is the body material; and the second material of the first fin extends from the body.

Example 3 may include the subject matter of Example 2, and further specifies that the second material has a lower CTE than the body material.

Example 4 may include the subject matter of Example 2, and further specifies that the second material has a higher CTE than the body material.

Example 5 may include the subject matter of any of Examples 2-4, and further specifies that: the body has a first face and second face opposite the first face; the second material of the first fin extends from the first face of the body; the plurality of fins comprise a second fin; the first material of the second fin is the body material; and the second material of the second fin extends from the second face of the body.

Example 6 may include the subject matter of Example 5, and further specifies that the second material of the first fin is a same material as the second material of the second fin.

Example 7 may include the subject matter of Example 1, and further specifies that the first material and the second material have CTEs that are higher than a CTE of the body material.

Example 8 may include the subject matter of any of Examples 1-7, and further specifies that: the plurality of fins comprise a first plurality of fins and a second plurality of fins; the body has a first face and a second face opposite the first face; and the first plurality of fins and the second plurality of fins are disposed in an alternating arrangement along the body.

Example 9 may include the subject matter of any of Examples 1-8, and further specifies that the body comprises a plurality of apertures, and the individual flexible fins extend into corresponding apertures of the plurality of apertures.

Example 10 may include the subject matter of Example 9, and further specifies that first ends of the individual flexible fins are secured to the body, and second ends of the individual flexible fins are not secured to the body.

Example 11 may include the subject matter of any of Examples 9-10, and further includes a dielectric substrate secured to the body.

Example 12 is a method of directing coolant in an IC device, including operating an IC device, wherein: the operation of the IC device causes a first region of the IC device to generate more heat than a second region of the IC device, and the IC device includes a FDD. The FDD may include a body comprising a body material, and a plurality of thermally deformable fins arranged along the body, wherein individual fins of the plurality of fins comprise a first material and a second material, and wherein the first material has a CTE different from a CTE of the second material. A first collection of one or more individual fins is closer to the first region of the IC device than the second region of the IC device, and a second collection of one or more individual fins is closer to the second region of the IC device than the first region of the IC device, and in response to the first region of the IC device generating more heat than the second region of the IC device, individual fins of the first collection deform to a greater degree than individual fins of the second collection.

Example 13 may include the subject matter of Example 12, and further specifies that deform to a greater degree includes increase a curvature.

Example 14 may include the subject matter of any of Examples 12-13, and further specifies that deform to a greater degree includes decrease a curvature.

Example 15 may include the subject matter of any of Examples 12-14, and further specifies that operating the IC device includes operating the IC device in a first mode. The method also includes operating the IC device in a second mode, wherein the operation of the IC device in the second mode causes the second region of the IC device to generate more heat than the first region of the IC device, and in response to the second region of the IC device generating more heat than the first region of the IC device, individual fins of the second collection deform to a greater degree than individual fins of the first collection.

Example 16 may include the subject matter of any of Examples 12-15, and may further include causing coolant to flow past the FDD, wherein greater curvature of the individual fins of the first collection causes the coolant to undergo more turbulence proximate to the individual fins of the first collection than proximate to individual fins of the second collection.

Example 17 may include the subject matter of any of Examples 12-16, and may further include causing coolant to flow past the FDD, wherein less curvature of the individual fins of the first collection causes a greater volume of coolant to flow proximate to the individual fins of the first collection than proximate to individual fins of the second collection.

Example 18 may include the subject matter of any of Examples 12-17, and further specifies that individual fins of the plurality of fins have longitudinal axes, and the longitudinal axes are oriented parallel to a direction of coolant flow.

Example 19 may include the subject matter of any of Examples 12-17, and further specifies that individual fins of the plurality of fins have longitudinal axes, and the longitudinal axes are oriented perpendicular to a direction of coolant flow.

Example 20 is an IC device, including: a plurality of components, the components comprising dies or packages; and an FDD coupled with at least one component of the plurality of components. The FDD may include a body comprising a body material, and a plurality of thermally deformable fins arranged along the body, wherein individual fins of the plurality of fins comprise a first material and a second material, the first material having a different CTE than a CTE of the second material.

Example 21 may include the subject matter of Example 20, and further specifies that the FDD is disposed in a channel between first and second ones of the components.

Example 22 may include the subject matter of any of Examples 20-21, and may further include a pump to circulate coolant past the FDD.

Example 23 may include the subject matter of any of Examples 20-22, and may further include a plurality of solder bumps or balls disposed within apertures of the body.

Example 24 may include the subject matter of any of Examples 20-23, and further specifies that: the plurality of components comprises a first component and a second component; the first component is disposed between the second component and a substrate; an underfill material is disposed between the substrate and the first component; and the FDD is disposed between the first component and the second component.

Example 25 may include the subject matter of Example 24, and further specifies that the substrate is a circuit board.

What is claimed is:

1. An array including at least first and second flow diversion devices disposed adjacent to each other, wherein each of the first and second flow diversion devices comprises:
   a separator having a first face and a second face opposite the first face;

a plurality of thermally deformable fins arranged along the first face and the second face, wherein individual fins of the plurality of fins include a first material and a second material, the first material having a lower coefficient of thermal expansion (CTE) than a CTE of the second material, wherein the individual fins include respective first ends that are secured to the respective first or second face of the separator, and second ends that are free from being secured to the respective first or second face of the separator and extend away from the respective first or second face;

wherein the separator includes: a plurality of apertures arranged corresponding to the individual fins along the first and second faces of the separator, wherein the individual fins of the plurality of fins extend into corresponding apertures of the plurality of apertures; and wherein the individual fins comprise a substantially curved shape in a first temperature state, and a substantially flat shape in a second temperature state, wherein a temperature associated with the first temperature state is lower than a temperature associated with the second temperature state, wherein an individual fin of the first flow diversion device and an individual fin of the second flow diversion device, the individual fin of the second flow diversion device being adjacent to the individual fin of the first flow diversion device, share an individual aperture.

2. The array of claim 1, wherein:

the plurality of fins comprise a first fin arranged along the first face and a second fin arranged along the second face of the separator, wherein the separator comprises a body of the first and second flow diversion devices;

the first material of the first fin is of a portion of body and the first material of the second fin is of another portion of the body; and the second material of the first and second fins extends from the body, respectively.

3. The array of claim 1, wherein the separator is formed from a dielectric or insulating material.

4. The array of claim 2, wherein the separator is formed from a dielectric or insulating material.

5. An array including at least first and second flow diversion devices disposed adjacent to each other, wherein each of the first and second flow diversion devices comprises:

a separator having a first face and a second face opposite the first face;

a plurality of thermally deformable fins arranged along the first and second faces, wherein individual fins of the second plurality of fins include a first material and a second material, the first material having a lower coefficient of thermal expansion (CTE) than a CTE of the second material, wherein the individual fins include respective first ends that are secured to the respective first or second face of the separator, and second ends that are free from being secured to the respective first or second face of the separator and extend away from the respective first or second face;

wherein the first face and the second face comprise a plurality of cavities arranged corresponding to the individual fins along the first and second faces of the separator, wherein the individual fins of the plurality of fins extend over corresponding cavities of the plurality of cavities; and wherein the individual fins comprise a substantially curved shape in a first temperature state, and a substantially flat shape in a second temperature state, wherein a temperature associated with the first temperature state is lower than a temperature associated with the second temperature state, wherein an individual fin of the first flow diversion device and an individual fin of the second flow diversion device, the individual fin of the second flow diversion device being adjacent to the individual fin of the first flow diversion device, share an individual cavity.

6. The array of claim 5, wherein the separator is formed from a dielectric material or an insulating material.

7. The array of claim 5, wherein:

the plurality of fins comprise a first fin arranged along the first face and a second fin arranged along the second face, wherein the first and second flow diversion devices comprise a body that includes the separator; and the first material of the first fin is of a portion of a body material on the first face and the first material of the second fin is of a portion of the body material on the second face.

* * * * *